United States Patent [19]

Fudeyasu

[11] Patent Number: 5,428,575
[45] Date of Patent: Jun. 27, 1995

[54] SEMICONDUCTOR MEMORY DEVICE WITH COMPARING CIRCUIT FOR FACILITATING TEST MODE

[75] Inventor: Yoshio Fudeyasu, Hyogo, Japan

[73] Assignee: Mitsubishi Denki Kabushiki Kaisha, Tokyo, Japan

[21] Appl. No.: 108,404

[22] Filed: Aug. 18, 1993

[30] Foreign Application Priority Data

Aug. 28, 1992 [JP]  Japan .................. 4-230455

[51] Int. Cl.⁶ .............................................. G11C 11/34
[52] U.S. Cl. ............................. 365/201; 365/230.03; 371/21.1
[58] Field of Search ............ 365/201, 230.03, 189.01; 371/21.1, 21.2, 21.3

[56] References Cited

U.S. PATENT DOCUMENTS 5,185,744  2/1993  Arimoto et al. ................. 371/21.2
5,228,000  7/1993  Yamagata ....................... 365/201

FOREIGN PATENT DOCUMENTS

4011987A1  2/1991  Germany .
598197     1/1984  Japan ........................... 365/201
63-102094  5/1988  Japan .
63-241791  10/1988  Japan .
2-83900    3/1990  Japan .
3-222200   10/1991  Japan .
3-295100   12/1991  Japan .

Primary Examiner—Joseph A. Popek
Assistant Examiner—Vu Le
Attorney, Agent, or Firm—Lowe, Price, LeBlanc & Becker

[57] ABSTRACT

A semiconductor memory device capable of storing a plurality of bits at the same address and of reducing a test time without increasing the number of pins includes comparing circuits located between a plurality of memory cell blocks from which data at the same address is read, and an input/output pin used in ordinary operations for reading and writing data. The comparing circuits serve to detect coincidence and non coincidence of the data from the memory cell blocks and the pin. Preferably, there is provided a logic for superposing outputs of the comparing circuits. An error flag signal supplied from the superposing logic is transmitted through a no-connection pin, thereby reducing the number of pins.

16 Claims, 17 Drawing Sheets

SEMICONDUCTOR MEMORY DEVICE WITH COMPARING CIRCUIT FOR FACILITATING TEST MODE

BACKGROUND OF THE INVENTION

1. Field of the Invention

The present invention relates to a semiconductor memory device, and in particular, relates to a design for facilitating a test of a semiconductor memory device in which input and output of a plurality of data at the same address are allowed.

2. Description of the Related Art

In recent years, semiconductor integrated circuit devices have been integrated to a higher extent, and in particular, the capacities of semiconductor memory devices have been significantly increased. This increase of the capacities, however, have caused the following disadvantages.

In an 8-bit computer, data of 8 bits can be simultaneously handled, and a unit of data stored in a memory is generally 8 bits. Such memory device may be formed, using semiconductor memories each having a capacity of 16 mega (M) bits per one chip, as shown in FIG. 1.

Referring to FIG. 1, a memory includes eight 16-Mbit semiconductor memory chips 212a-212h. One bit is stored at the same address of each of the memory chips 212a-212h, and data of 8 bits stored in the same address is handled as one byte. Thus, in a write operation, the same address in each of the memory chips 212a-212h is designated, and each bit in one byte is written in the corresponding memory chip. In a read operation, the same address in each of the memory chips 212a-212h is designated for reading one bit, whereby data of 1 byte is formed.

In the memory thus constructed, addresses up to 16 Mbits are available in each memory chip. The semiconductor memory chip, in which different addresses are allocated to the respective bits in a 16 Mbit memory region, has been referred to as "16 Mbits×1" (or "16×1") structure memory. The memory in FIG. 1 using the eight memory chips of 16×1 structure can store the data of 16 Mbytes.

However, such large capacity of one structure may cause a following disadvantage. If the memory capacity of a computer is insufficient, additional memories must be used. If the computer has used the memory of the structure shown in FIG. 1, eight memories each having the capacity of 16 Mbits must be added. Thus, the storage capacity of 16 Mbytes is additionally used. Eight semiconductor memory chips each having the capacity of 16 Mbits are used for this purpose.

However, it is seldom required to add such large memory at a time. The addition of the many and large memory chips at one time is expensive. For example, in personal computers, if a memory consists of semiconductor chips of large capacities, a disadvantage may be caused relating to handling of the memories.

In order to overcome the foregoing disadvantage, there has been proposed a method in which a storage capacity of one memory chip is unchanged, but a memory region of the one memory chip is divided into a plurality of memory sections (also referred to as "memory blocks"). Each memory block has addresses independent from those of the other memory blocks, and multiple data are stored at the same address in one chip.

Referring to FIG. 2, description will be made on a semiconductor memory chip in which each memory region of 16 Mbits is divided into four memory blocks each having a capacity of 4 Mbits (this structure is referred to as "4 Mbits×4" structure or "4×4" structure). A semiconductor memory chip 214a includes memory blocks 216a, 218a, 220a and 222a each having a storage capacity of 4 Mbits. Each memory block stores one bit of data at one address. This memory chip 214a stores 4 bits at the same address. Similarly, the semiconductor memory chip 214b of 4×4 structure includes four memory blocks 216b (not shown), 218b, 220b and 222b. The memory chip 214b can store data of 4 bits at the same address. By using the combination of the two semiconductor memory chips 214a and 214b, data of 8 bits can be stored at and read from the same address.

If two semiconductor memory chips each having the 4×4 structure are used, input and output of data of 1 byte is allowed. Consequently, two semiconductor memory chips each having a capacity of 16 Mbits can achieve a function similar to that of the memory shown in FIG. 1.

The semiconductor memory chip having the 4×4 structure shown in FIG. 2 has an advantage that the storage capacity of a minimum unit can be reduced while using the semiconductor memory chip of a large capacity. In an example shown in FIG. 2, a function similar to that of the memory in FIG. 1 is achieved, and also the storage capacity is 4 Mbytes, i.e., a quarter of that (16 Mbytes) of the memory in FIG. 1. By reducing the unit of the storage capacity of the minimum structure, the unit of the storage capacity for addition can be significantly reduced, compared with that of the structure shown in FIG. 1. This enables a specific design of configuration of the memory, and facilitates the change of configuration.

Particularly, if a main stream of computers changes from the current 16 bit computers to 32 bit computers, the unit of data handled in one time changes from 16 bits to 32 bits. If the memory of the configuration shown in FIG. 1 were used, the minimum unit of the memory would be 64 Mbytes (16 Mbits×32=2 Mbytes×32), which would be almost unnecessary for personal users. Also such memories are excessively expensive, and thus may be unavailable for the personal users in some cases. In such case, the memory chip shown in FIG. 2 can be expected to fully satisfy demand of such users.

FIG. 3 is a block diagram showing a semiconductor memory chip having a structure similar to the semiconductor memory chip 214a of the 4 Mbits×4 structure, and specifically, showing a 1 Mbit semiconductor memory chip 230 of a 256 kilobit (Kbit)×4 structure.

Referring to FIG. 3, the semiconductor memory chip 230 have pins 48, 50, 52, 66 which receive an external column address strobe ($\overline{CAS}$) signal, a row address strobe ($\overline{RAS}$) signal, a write control ($\overline{WE}$) signal and an output enable ($\overline{OE}$) signal, respectively. The semiconductor memory chip 230 also has address signal input pins 32 receiving an address signal ($A_0$-$A_8$) of 9 bits, a power supply pin receiving a supply voltage Vcc, a ground pin receiving a ground potential Vss, four input-/output pins ($DO_1$-$DO_4$) 62 for transmitting data, and a no-connection pin (NC pin) 234.

The semiconductor memory chip 230 is provided with a memory cell array 42 divided into four memory blocks 42a-42d. Each of the memory blocks 42a-42d has a storage capacity of $2^3 \times 2^9 = 256$ Kbits. Thus, the memory cell 29 array 42 has a storage capacity of 1 Mbit as a whole.

The semiconductor memory chip 230 further includes a row and column address buffer 34 connected to the address signal input pins 32, row and column decoders 36 and 38 connected to the row and column address buffer 34, and sense amplifiers 40 connected to the column decoder 38 and the memory cell array 42, as well as a data input buffer 44 and a data output buffer 46 connected between the sense amplifiers 40 and the input/output pins 62.

$\overline{CAS}$ signal pin 48 and $\overline{RAS}$ signal pin 50 are connected to a clock signal generating circuit 232. The clock signal generating circuit 232 serves to apply a clock signal for determining an operation cycle of the semiconductor memory chip 230 to the row and column address buffer 34, row decoder 36, column decoder 38, sense amplifiers 40 and data output buffer 46. An AND circuit 56 is connected to the clock signal generating circuit 232 and the $\overline{WE}$ signal pin 52. The $\overline{WE}$ signal is applied to one of the inputs of the AND circuit 56 after being inverted. The AND circuit 56 is synchronized with the clock signal applied from the clock signal generating circuit 232 to apply the signal formed by inversion of the $\overline{WE}$ signal to the data input buffer 44 and data output buffer 46. The $\overline{OE}$ signal is applied to the data output buffer 46.

The semiconductor memory chip 230 of the 256 Kbits×4 structure in the prior art shown in FIG. 3 operates as follows. The external row address signal is applied to the address signal input pins 32. The row and column address buffer 34 temporarily stores it and then applies the same to the row decoder 36. The row decoder 36 decodes the row address signal and selects corresponding one word line in each of the memory cell blocks 42a–42d. Then, the address signal input pins 32 receive the externally applied column address signal. The row and column address buffer 34 temporarily stores it and then applies the same to the column decoder 38. The column decoder 38 selects the corresponding bit line in each of the memory cell blocks 42a–42d by means of the sense amplifiers 40.

In the data write operation, data of 4 bits are supplied through the I/O pins 62 to the data input buffer 44. The memory blocks 42a–42d each receive the 1 bit of the data through the sense amplifiers 40. In each of the memory blocks 42a–42d, the data of 1 bit is written into the memory cell located at the crossing of the selected word line and selected bit line.

In the read operation, the memory cells are selected similarly to the foregoing write operation. In each of the memory blocks 42a–42d, 1 bit of the data is read from the memory cell located at the crossing of the selected word line and the selected bit line. The 4 bits thus read are applied through the sense amplifiers 40 to the data output buffer 46 and are temporarily stored therein. The data output buffer 46 externally supplies the data of 4 bits through the I/O pins 62 in response to the $\overline{OE}$ signal.

Whether the semiconductor memory chip 230 of the 256 Kbits×4 structure operates normally or not can be determined in the following manner, using a dedicated tester. First, the tester is connected to the I/O pins 62, and predetermined data is written into each of the memory blocks 42a–42d. One bit of the data written in each memory block, i.e., 4 bits in total, is read from the same address in each memory block, and each data of 4 bits thus read is applied to the tester through the I/O pins 62. The tester compares the received 4-bit signal with the original data written at the address from which the received 4 bits are read. If all the bits coincide with each other, the tester determines as normal. If there is noncoincidence of at least one bit, it determines as abnormal, in which case the semiconductor memory chip is dealt with as unacceptable.

The semiconductor memory device, which has the memory cell array divided into the multiple memory blocks as described above, has such a disadvantage that it requires many pins for the input and output of data, compared with the memory handling the whole memory cells as one address space. On the other hand, it has such an advantage that, since it allows simultaneous testing of all the memory blocks, it requires less time for testing the memory cell array, compared with the semiconductor memory chip having the memory cell array not divided into memory blocks and having an equal storage capacity. However, if the memory cell array were divided into more memory blocks in order to reduce the test time, the number of required I/O pins would also increase. This would also increase the number of pins in the tester, resulting in increase of cost of a hardware of the tester.

SUMMARY OF THE INVENTION

Accordingly, it is an object of the invention to provide a semiconductor memory device, in which a memory region is divided into a plurality of memory sections capable of storing a plurality of data at the same address, and a test time can be reduced without increasing the number of pins.

It is another object of the invention to provide a semiconductor memory device, in which a memory region is divided into a plurality of memory sections capable of storing a plurality of data at the same address, and a data input/output pin is used as an input pin for comparison data for reducing a test time while suppressing increase of the number of pins.

It is still another object of the invention to provide a semiconductor memory device, in which a memory region is divided into a plurality of memory sections capable of storing a plurality of data at the same address, and a no-connection pin is used for reducing a test time without increasing the number of pins.

It is yet another object of the invention to provide a semiconductor memory device, in which a memory region is divided into a plurality of memory sections capable of storing a plurality of data at the same address, and an existing input/output pin is used for reducing a test time without increasing the number of pins.

It is further another object of the invention to provide a semiconductor memory device, in which a memory region is divided into a plurality of memory sections capable of storing a plurality of data at the same address, and an input/output pin to be used for another purpose is used for reducing a test time without increasing the number of pins.

A semiconductor memory device according to the invention includes a circuit for supplying a mode designating signal having one of first and second values which are different from each other, a memory cell array including a plurality of memory sections, a selecting circuit for selecting the same address in each memory section for reading and writing data, a plurality of input/output pins, each of which is provided correspondingly to one of the memory sections for transmitting the data read and written by the selecting circuit, and a plurality of comparing circuits, which are arranged between the selecting circuit and the plurality of input/output pins and each are provided correspondingly to one of the memory sections, each comparing circuit being responsive to the second value of the mode designating signal to compare the data read from each memory section with data supplied through the corresponding input/output pin.

In the semiconductor memory device, the data applied through the input/output pins is written by the selecting circuit at the same address in the plurality of memory sections in the memory cell array. The data read by the selecting circuit from the same address in the plurality of memory sections is likewise supplied through the input/output pins. The plurality of input/output pins, which are provided for the data read and written by the selecting circuit, also receive the data for comparison when the mode designating signal goes to the second value. The comparing circuit compares the data for comparison and the data read from the each memory section. Since the input/output pins, which are provided for the input and output of the data to and from the selecting circuit, can be also used for the input of the data for comparison, it is not necessary to additionally provide dedicated pins for the data of comparison, and thus increase of the number of the input/output pins can be prevented.

Preferably, the semiconductor memory device further includes a coincidence detecting circuit, which is connected to an output of each comparing circuit for detecting whether or not all the data read from the respective memory sections coincide with the data supplied through the corresponding input/output pins.

In this semiconductor memory device, the coincidence detecting circuit detects whether or not all the data read from the respective memory sections coincide with the corresponding data for comparison. Based on an output of the coincidence detecting circuit, it can be determined whether all the data stored at the same address in the respective memory sections have the correct values or not. Since the above comparison for the plurality of memory sections in the memory cell array can be carried out simultaneously, inspection of the stored data in the memory cell array can be carried out in a shorter time, compared with the conventional memory cell array having an equal storage capacity.

More preferably, the semiconductor memory device includes a no-connection input/output pin, which is not used in an ordinary operation and is connected to an output of the coincidence detecting circuit.

In this semiconductor memory device, the output of the coincidence detecting signal can be supplied through the no-connection or unused input/output pin, and thus can be determined without additionally providing a dedicated input/output pin. The no-connection pin can be effectively used, suppressing the increase of the number of pins in the semiconductor memory device.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Semiconductor memories of several embodiments of the invention will be described hereinafter with reference to the drawings. In the embodiments described below, a memory cell array is divided into four memory blocks, but the number of the memory blocks is not restricted to four.

Figure 1:
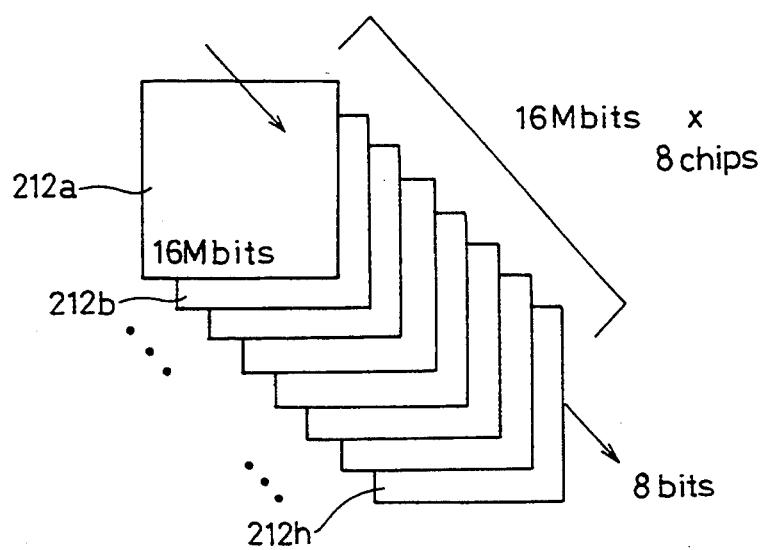
FIG. 1 shows structure of a memory for an 8-bit computer using eight semiconductor memory chips each having a 16 Mbits×1 structure.
Figure 2:
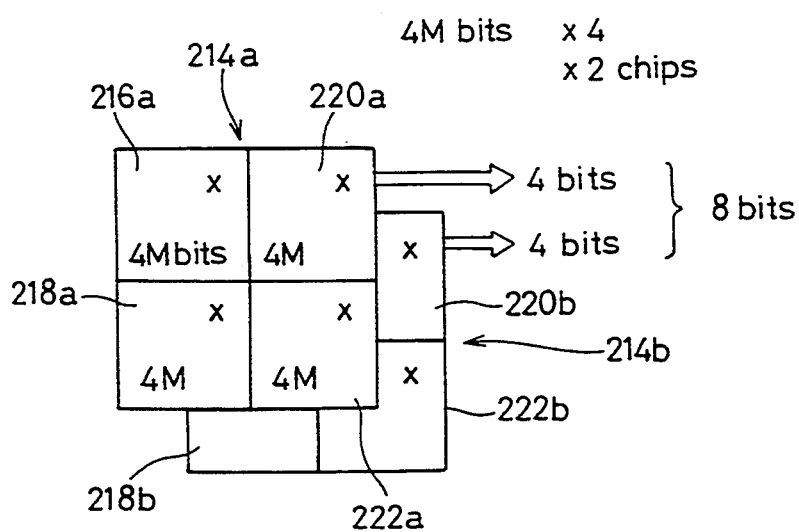
FIG. 2 shows structure of a memory for an 8-bit computer using two semiconductor memory chips each having a 4 Mbits×4 structure.
Figure 3:
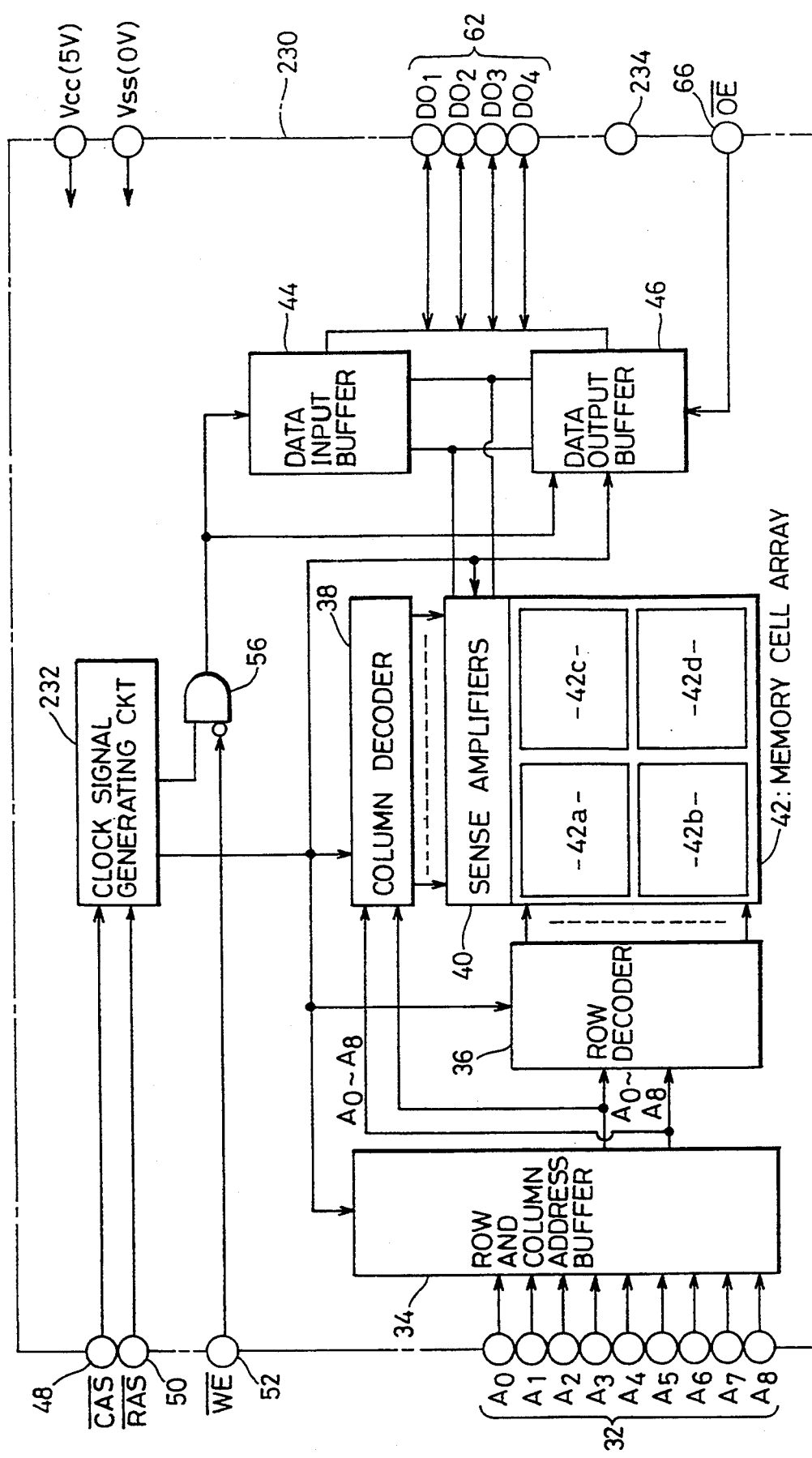
FIG. 3 is a block diagram of a semiconductor memory chip in the prior art.
Figure 4:
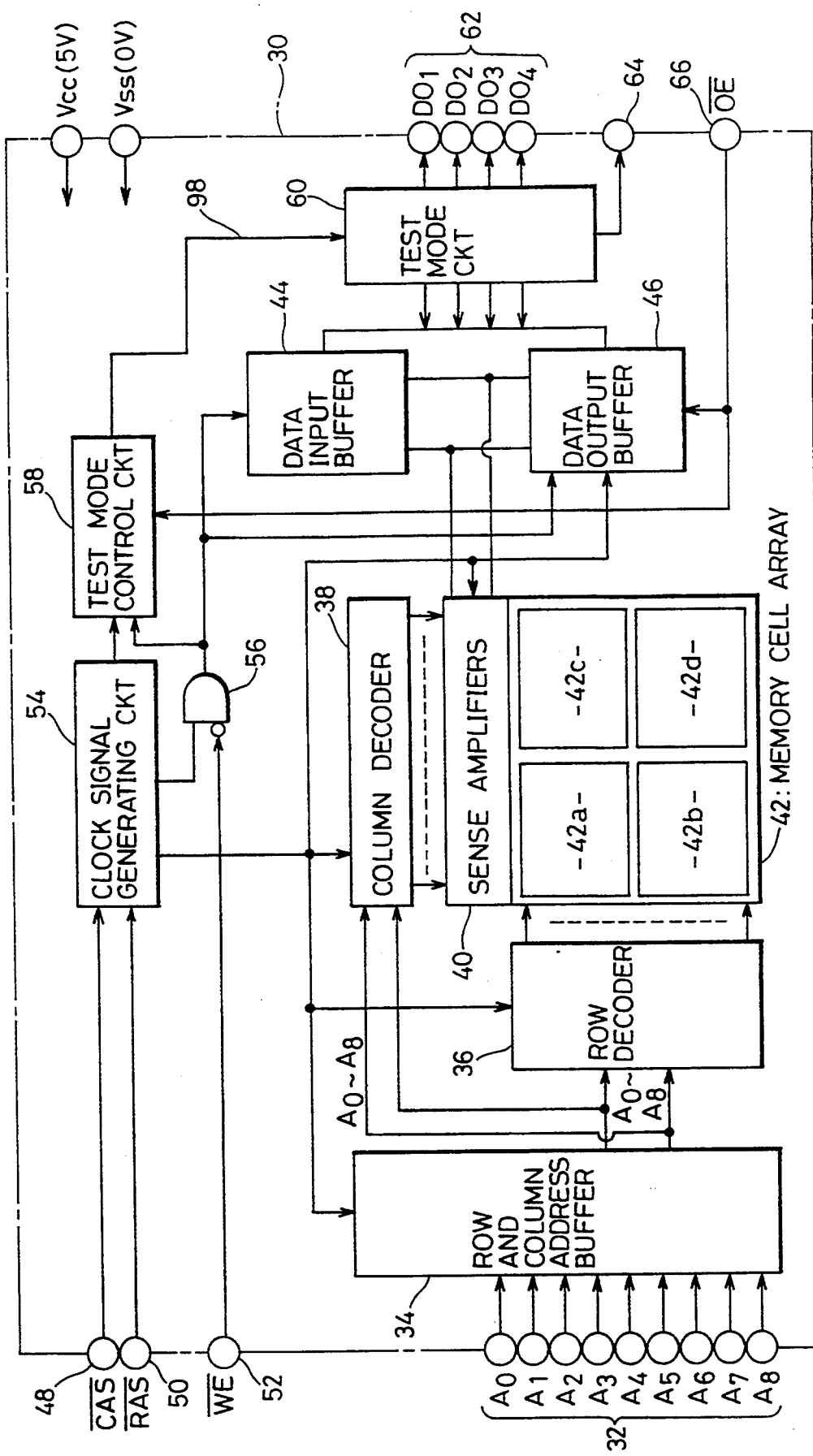
FIG. 4 is a block diagram of a semiconductor memory chip of a 256 Kbits×4 structure of an embodiment of the invention.

FIG. 4 is a block diagram of a semiconductor memory chip 30 of a first embodiment of the invention. The semiconductor memory chip 30 includes pins 48, 50, 52, 66 for receiving $\overline{CAS}$ signals, $\overline{RAS}$ signals, $\overline{WE}$ signals and $\overline{OE}$ signals, respectively, and further includes address signal input pins 32 for receiving an address signal ($A_0$–$A_8$) of 9 bits, I/O pins ($DO_1$, $DO_2$, $DO_3$ and $DO_4$) 62 for transmission of data, a power supply pin and a ground pin. The semiconductor memory chip 30 further has an error flag output pin 64 for supplying an error flag signal indicative of a result of test of a memory cell array cell, which will be described later. The error flag output pin 64 is the same as the NC pin 234 shown in FIG. 3.

Referring to FIG. 4, the semiconductor memory chip 30 is provided with a memory cell 42 divided into four memory blocks 42a–42d.

Figure 5:
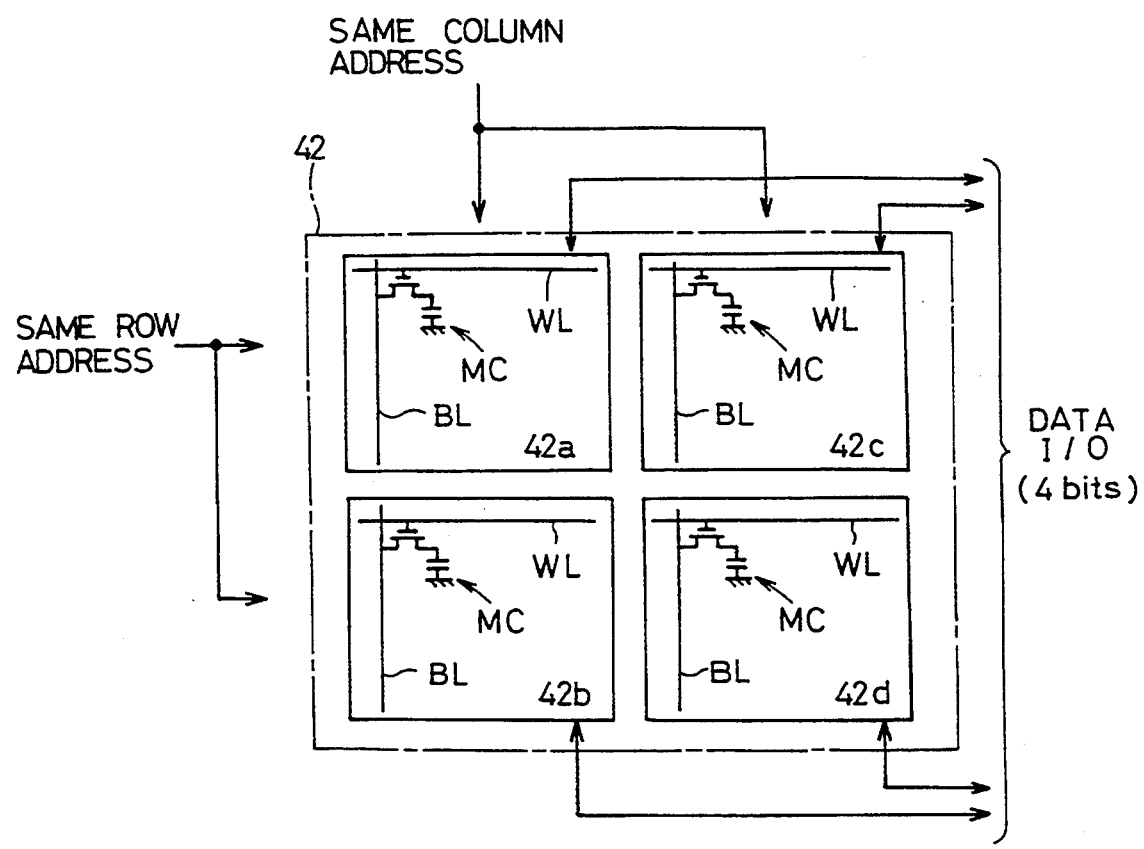
FIG. 5 is a specific block diagram of a memory cell array.

Referring to FIG. 5, each of the memory blocks 42a–42d of the memory cell 42 includes a plurality of word lines WL formed in a lateral direction, and a plurality of bit lines BL formed perpendicular to the word lines WL. A memory cell MC storing data of 1 bit is formed at each crossing of the word line WL and bit line BL. In this embodiment, each of the memory blocks 42a–42d includes 256K memory cells MC. Therefore, the memory cell array 42 has a storage capacity of 256 Kbits×4=1 Mbits.

Referring to FIG. 4 again, the semiconductor memory chip 30 includes a row and column address buffer 34 which is connected to address signal input pins 32 for temporarily storing an externally supplied address signal, a row decoder 36 which decodes a row address signal supplied from the row and column address buffer 34 for selecting a predetermined word line WL in each of the memory blocks 42a–42d, a column decoder 38 which decodes a column address signal supplied from the row and column address buffer 34 for selecting a predetermined bit line BL in each of the memory blocks 42a–42d, sense amplifiers 40 for amplifying and reading data supplied from the selected memory cells in the memory blocks 42a–42d to the corresponding bit lines BL, a data output buffer 46, which is connected to the sense amplifiers 40 and $\overline{OE}$ pin 66 for temporarily storing the data of 4 bits supplied from the sense amplifiers 40, and a data input buffer 44, which is connected to the sense amplifiers 40 for temporarily storing the data of 4 bits to be written into the memory cell array 42.

Between the I/O pins 62 and the data buffers 44 and 46, there is provided a test mode circuit 60, which is different from the semiconductor memory chip 230 in the prior art shown in FIG. 3, forming a feature of the invention. The output of the test mode circuit 60 is connected to the error flag output pin 64. The test mode circuit 60 will be described in detail later.

The $\overline{CAS}$ pin 48 and $\overline{RAS}$ pin 50 are connected to a clock signal generating circuit 54, which supplies a clock signal to the row and column address buffer 34, row decoder 36, column decoder 38, sense amplifiers 40 and data output buffer 46 for deciding an operation cycle of the semiconductor memory chip 30. The $\overline{WE}$ pin 52 is connected to one input of an AND circuit 56, of which other input is connected to the clock signal generating circuit 54. The AND circuit 56 applies its output to the data input buffer 44 and data output buffer 46. The $\overline{WE}$ signal is applied to the AND circuit 56 after being inverted.

The semiconductor memory chip 30 further includes a test mode control circuit 58, which is connected to the clock signal generating circuit 54, output of the AND circuit 56 and $\overline{OE}$ pin 66. The test mode control circuit 58 generates a test control signal 98 for changing internal connection of the test mode circuit 60 in accordance with the operational mode.

Figure 6:
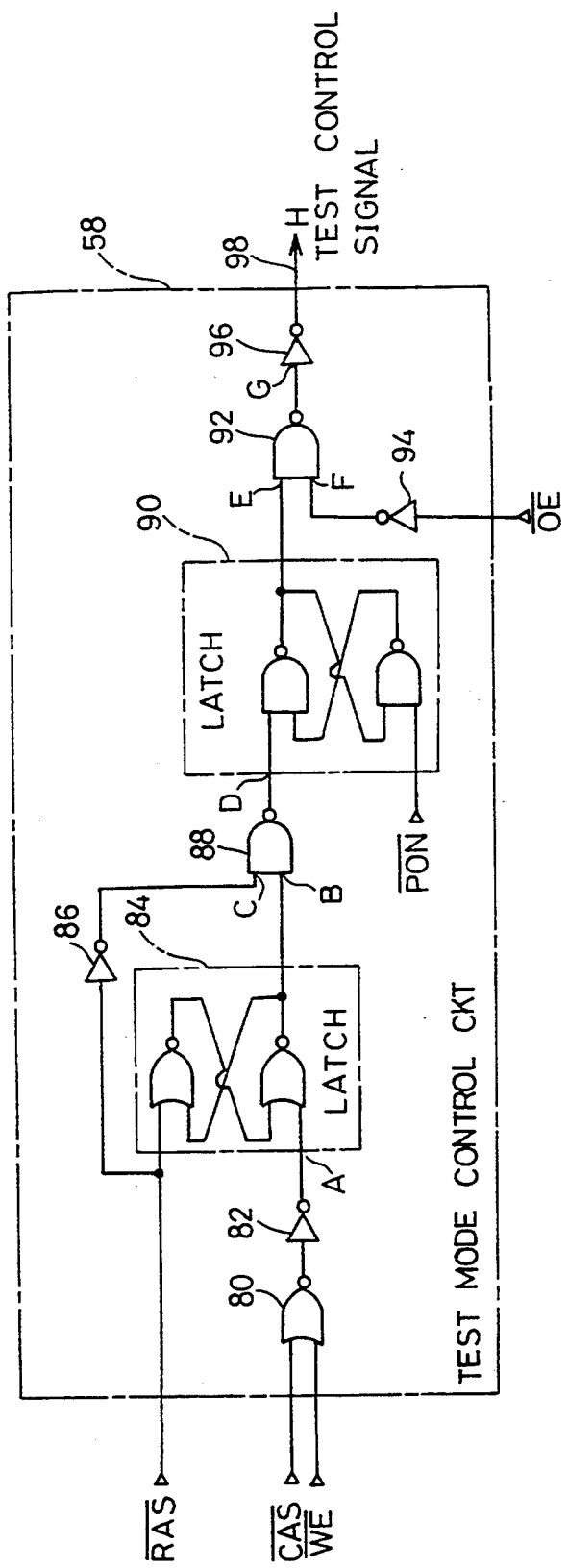
FIG. 6 is a block diagram of a test mode control circuit.

Referring to FIG. 6, the test mode control circuit 58 receives the $\overline{RAS}$ signal, $\overline{CAS}$ signal, $\overline{WE}$ signal and $\overline{OE}$ signal. It also receives a $\overline{PON}$ signal, which is maintained at a low level (will be referred to as "L-level") for a predetermined time after power-on of the semiconductor memory chip 30 and then attains a high level (will be referred to as "H-level"). The clock signal generating circuit 54 shown in FIG. 4 applies a clock signal (not shown) to the test mode control circuit 58.

Referring to FIG. 6, the test mode control circuit 58 includes an NOR circuit 80 having one input receiving the $\overline{CAS}$ signal and the other input receiving the $\overline{WE}$ signal, an inverter 82 having an input connected to an output of the NOR circuit 80, a latch circuit 84 receiving the $\overline{RAS}$ signal and an output signal of the inverter 82, an inverter 86 having an input receiving the $\overline{RAS}$ signal, a NAND circuit 88 having inputs connected to outputs of the inverter 86 and latch circuit 84, a latch circuit 90 receiving an output of the NAND circuit 88 and the $\overline{PON}$ signal, an inverter 94 having an input receiving $\overline{OE}$ signal, a NAND circuit 92 having inputs connected to outputs of the latch circuit 90 and inverter 94, and an inverter 96 having an input connected to an output of the NAND circuit 92. The latch circuits 84 and 90 are constructed as shown in FIG. 6.

Figure 7:
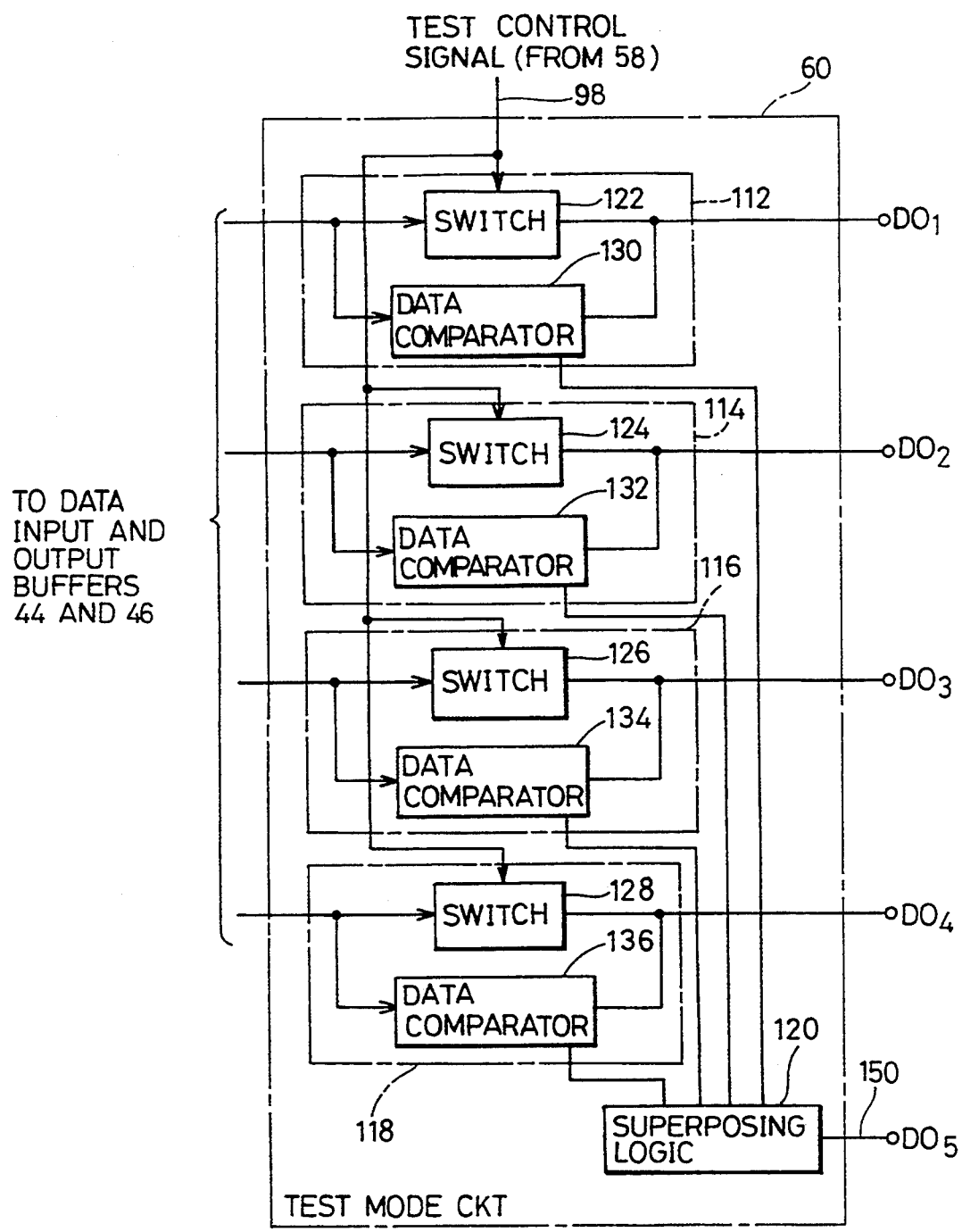
FIG. 7 is a block diagram of a test mode circuit.

Referring to FIG. 7, the test mode circuit 60 includes four 1-bit test mode circuits 112, 114, 116 and 118, and a superposing logic 120 for superposing signals indicative of test results, which are supplied by the 1-bit test mode circuits 112, 114, 116 and 118, and applying the error flag signal 150 to the error flag output pin 64.

The four 1-bit test mode circuits 112, 114, 116 and 118 have the same structures. For example, the 1-bit test mode circuit 112 includes a switch circuit 122 and a data comparator 130. The switch circuit 122 connects or disconnects the data input buffer 44 and data output buffer 46 to and from the I/O pin $DO_1$ in response to the test control signal 98. The data comparator 130 compares the data supplied from the data output buffer 46 with an expected value applied from a tester through the I/O pin $DO_1$, and supplies the result of comparison to the superposing logic 120. The "expected value" is a value of the data, assuming that the data is correctly read from the corresponding address in each memory block. Since predetermined data has been written in each memory cell in an earlier stage of the test, the data thus written may be used as the expected value.

Similarly to the 1-bit test mode circuit 112, the 1-bit test mode circuit 114 includes a switch circuit 124 and a data comparator 134. The 1-bit test mode circuit 116 includes a switch circuit 126 and a data comparator 136. The 1-bit test mode circuit 118 includes a switch circuit 128 and a data comparator 138. The switch circuits 124, 126 and 128 have structures similar to that of the switch circuit 122 except for that they are connected to different pins and comparators. The data comparators 132, 134 and 136 have structures similar to that of the data comparator 130. Therefore, they will not be detailed hereinafter.

Figure 8:
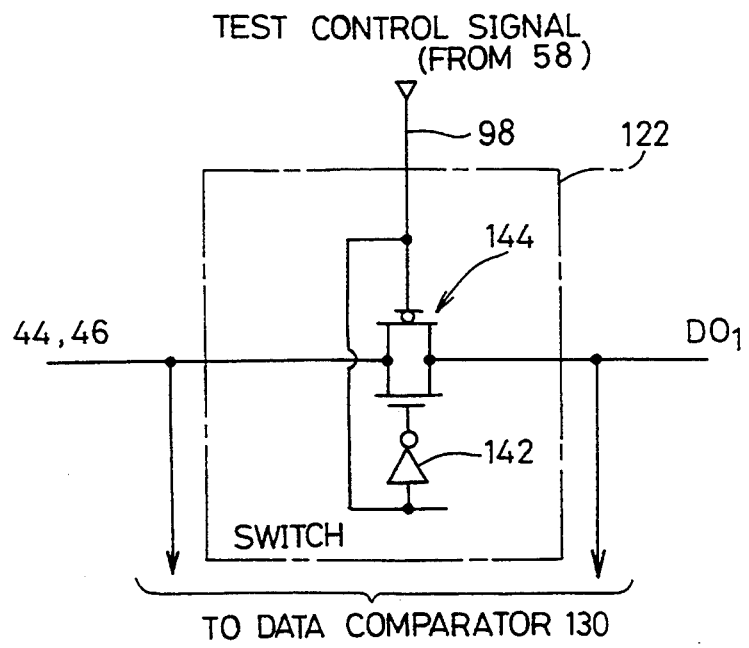
FIG. 8 is a block diagram of a switch circuit.

Referring to FIG. 8, the switch circuit 122 includes an inverter 142 for inverting the test control signal 98, and a transfer gate 144 which operates in response to the test control signal 98 and an output of the inverter 142. The transfer gate 144 has one input connected to the I/O pin $DO_1$ and the other input connected to the data input buffer 44 and data output buffer 46. Both terminals of the transfer gate 144 are connected to the data comparator 130.

Figure 9:
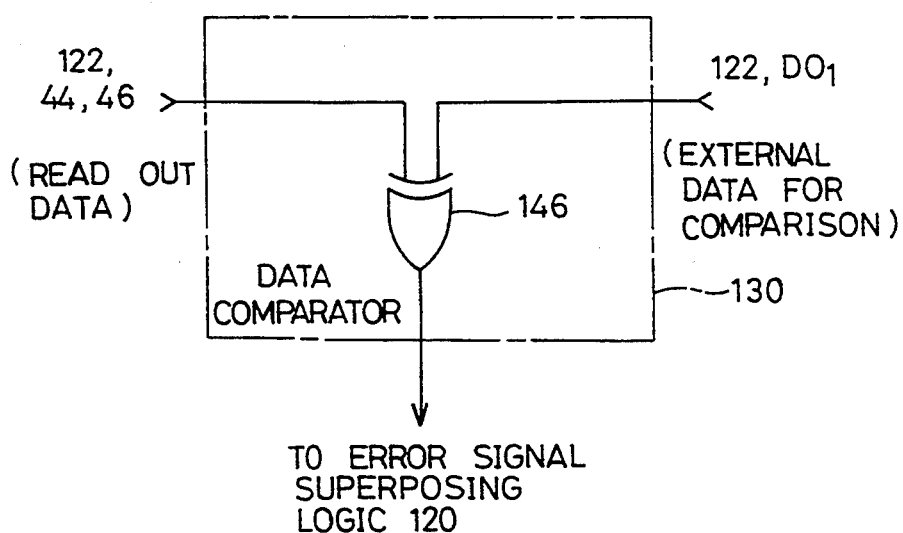
FIG. 9 is a block diagram of a data comparator.

Referring to FIG. 9, the data comparator 130 includes an exclusive OR (will be referred to hereinafter as "EXOR") circuit 146 having one input connected to one of two terminals of the switch circuit 122, which is connected to the data input buffer 44 and data output buffer 46, and the other input connected to the I/O pin $DO_1$ of the switch circuit 122. An output of the EXOR circuit 146 is connected to the error signal superposing logic 120.

Figure 10:
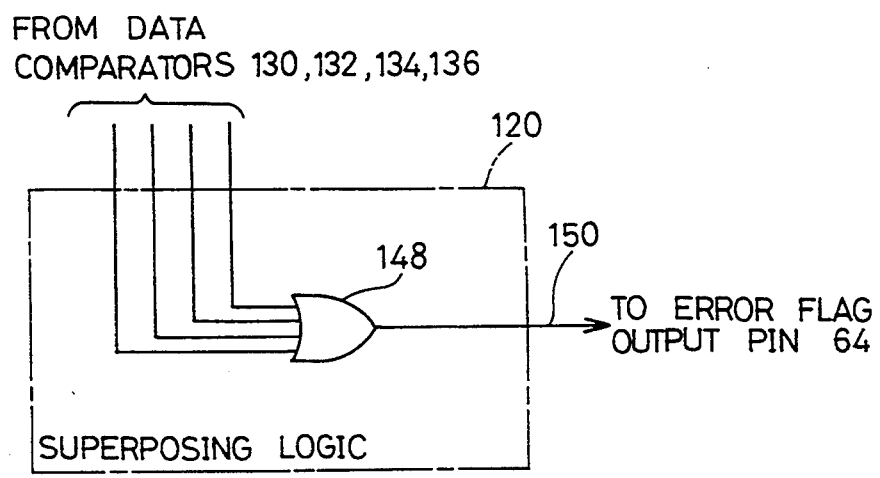
FIG. 10 is a block diagram of a superposing logic.

Referring to FIG. 10, the superposing logic 120 includes an OR circuit 148 having four inputs connected to outputs of the data comparators 130, 132, 134 and 136, respectively. An output of the OR circuit 148 is connected to the error flag output pin 64. A signal supplied by the OR circuit is the error flag signal 150.

Referring to FIGS. 4–10, the semiconductor memory chip 30 of this embodiment operates as follows. Now, operations for (1) ordinary write, (2) ordinary read, (3) test mode setting and (4) test read will be described below.

(1) Ordinary Write Operation

Figure 11:
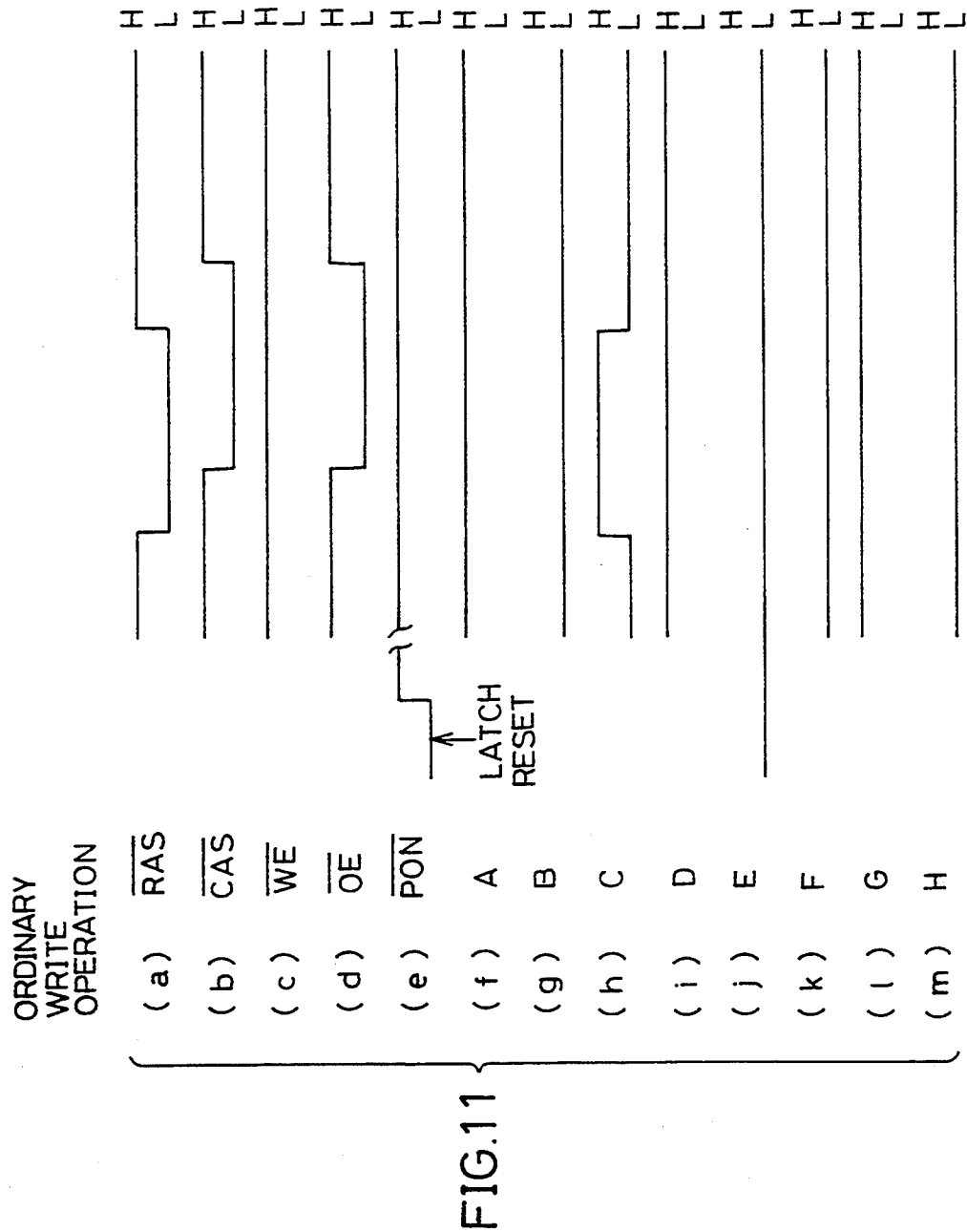
FIG. 11 is a timing chart showing an ordinary write operation.

In the ordinary write operation, the respective signals shown in FIG. 6 and signals (A)–(H) supplied to or from the respective circuits change as shown in FIG. 11. After the power-on of the semiconductor memory chip 30, the $\overline{PON}$ signal maintains the L-level for a predetermined time, and then attains the H-level as shown in FIG. 11 (e). In response to the change of the $\overline{PON}$ signal to the L-level, the latch circuit 90 shown in FIG. 6 is reset and generates the output at the L-level as shown in FIG. 11 (j).

Even after the signals $\overline{RAS}$, $\overline{CAS}$, $\overline{WE}$ and $\overline{OE}$ change as shown in FIG. 11 (a)–(d), the signal supplied to the latch circuit 90 is fixed at the H-level as shown in FIG. 11 (i). Therefore, the output of the latch circuit 90 is maintained at the L-level as shown in FIG. 11 (j), and the test control signal supplied from the test mode control circuit 58 is always maintained at the L-level as shown in FIG. 11 (m).

Referring to FIG. 8, since the test control signal 98 is fixed at the L-level, the transfer gate 144 connects the data input buffer 44 and data output buffer 46 to the I/O pin $DO_1$. In the ordinary write operation, the data to be written is supplied through the I/O pin $DO_1$ to the data input buffer 44, and is temporarily stored therein. Other switch circuits 124, 126 and 128 in FIG. 7 operate similarly. In this operation, as shown in FIG. 7, the four I/O pins $DO_1$–$DO_4$ each supply 1 bit, i.e., 4 bits in total, to the data input buffer 44. The data input buffer 44 in FIG. 4 temporarily stores the 4 bits, and then supplies them to the sense amplifier 40.

Referring to FIG. 4, the address signal input pins 32 receive the row address signal of 9 bits ($A_0$–$A_8$). The row and column address buffer 34 temporarily stores the row address signal, and applies the same to the row decoder 36. The row decoder 36 decodes the applied row address signal, and selects corresponding one word line WL in each of the memory blocks 42a–42d.

Then, the address signal input pins 32 receive the column address ($A_0$–$A_8$). The row and column address buffer 34 temporarily stores the column address signal, and applies the same to the column decoder 38. The column decoder 38 decodes the column address signal, and selects the corresponding one bit line BL in each of the memory blocks 42a–42d through the sense amplifier 40. Thereby, the memory cells MC (see FIG. 5) at the same address in the memory blocks 42a–42d are selected. Respective one bit of the data of 4 bits stored in the data input buffer 44 is written into each selected memory cell MC.

(2) Ordinary Read Operation

Figure 12:
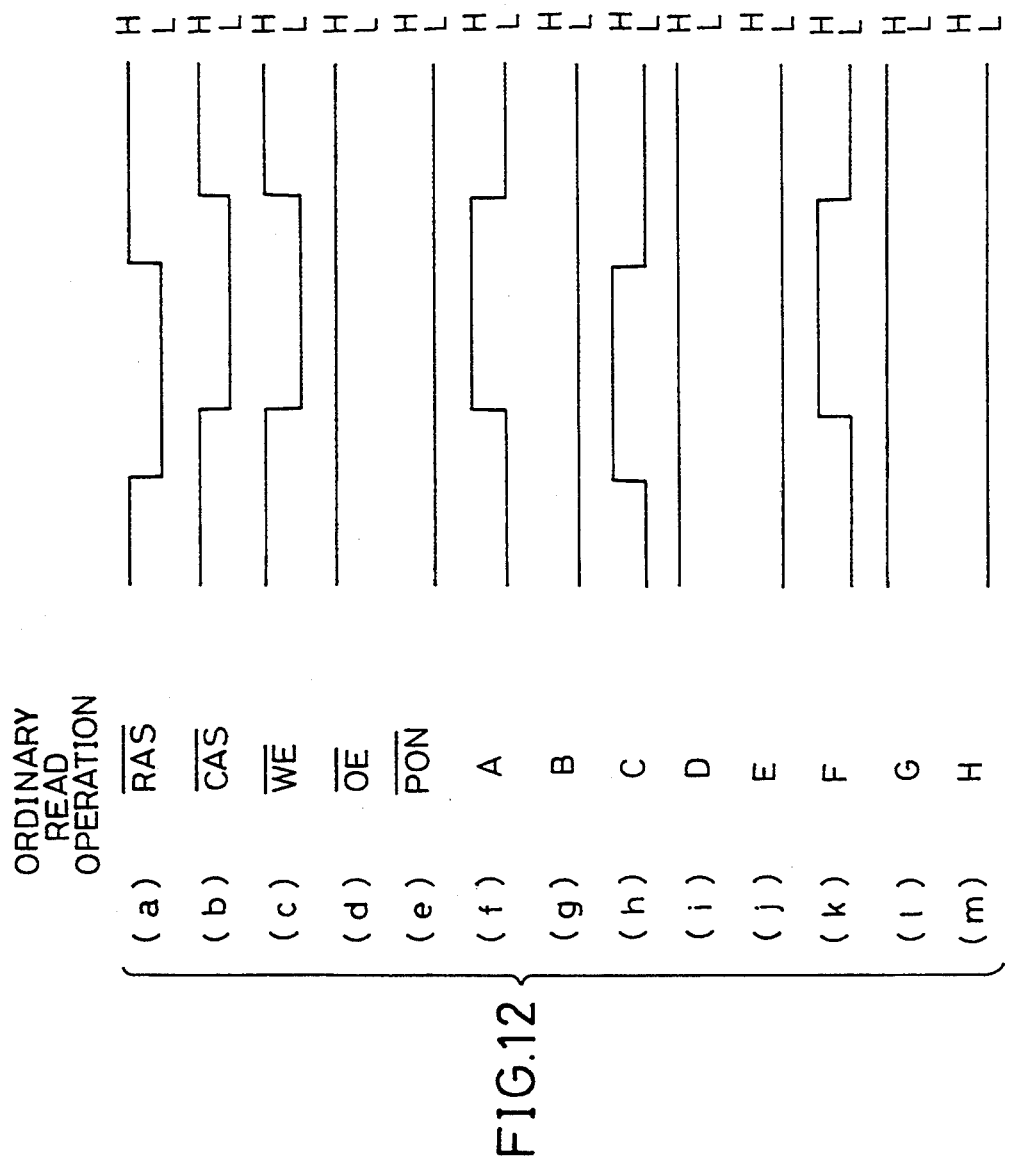
FIG. 12 is a timing chart showing an ordinary read operation.

FIG. 12 is a timing chart showing waveforms of respective portions of the test mode control circuit 58 in the ordinary read operation. The timing chart shown in FIG. 12 is substantially the same to the timing chart in the ordinary write operation shown in FIG. 11, except for FIG. 12 (k). Therefore, as shown in FIG. 12 (m), the test control signal 98 supplied from the test mode control circuit 58 shown in FIG. 6 is fixed at the L-level.

Referring to FIG. 4 again, the address signal input pins 32 first receive the row address signal ($A_0$–$A_8$). The row and column address buffer 34 temporarily stores the row address signal, and applies the same to the row decoder 36. The row decoder 36 decodes the row address signal, and selects corresponding one word line WL in each of the memory blocks 42a–42d.

Then, the address signal input pins 32 receive the column address ($A_0$–$A_8$). The row and column address buffer 34 temporarily stores the column address signal, and applies the same to the column decoder 38. The column decoder 38 decodes the column address signal, and selects the corresponding one bit line BL in each of the memory blocks 42a–42d through the sense amplifier 40. Thereby, the memory cells MC (see FIG. 5) at the same address, which is designated by the row address signal and column address signal, in the memory blocks 42a–42d are selected.

The sense amplifier 40 reads the data from the selected memory cells MC through the bit lines BL, and applies the same to the data output buffer 46. One bit is read from one memory block. Therefore, 4 bits are read from the whole memory cell array 42 and are stored in the data output buffer 46.

Referring to FIG. 8, since the test control signal 98 is fixed at the L-level, as described before, the transfer gate 144 is closed. The data output buffer 46 is connected to the I/O pin $DO_1$. Referring to FIG. 7, the other switches 124, 126 and 128 are likewise closed. The data output buffer 46 is connected to the I/O pins $DO_1$–$DO_4$. Therefore, respective one bit of the data at the same address in each of the memory cells 42a–42d is supplied through each of the I/O pins $DO_1$–$DO_4$.

(3) Test Mode Setting Operation

Figure 13:
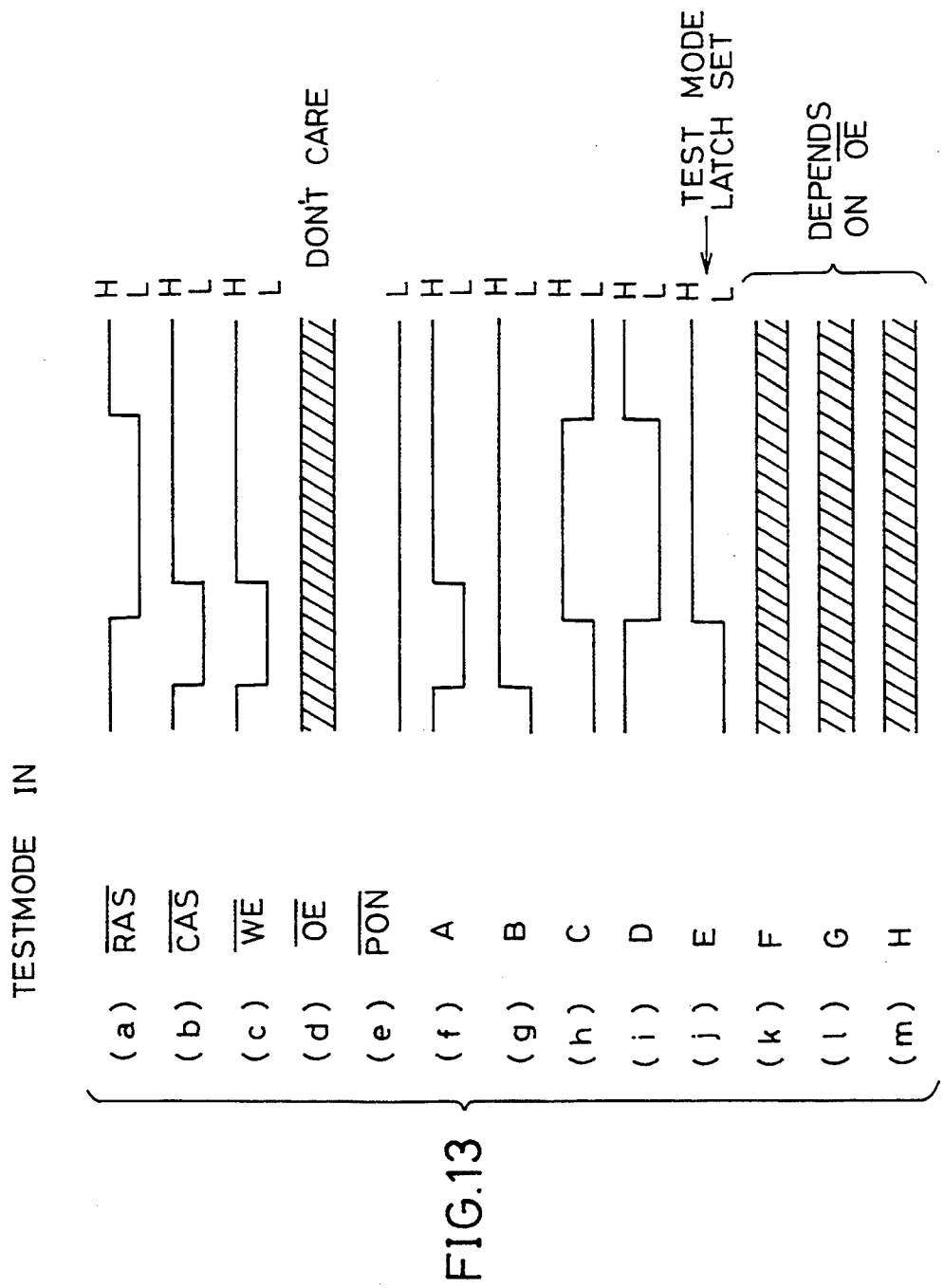
FIG. 13 is a timing chart showing a test mode.

When the semiconductor memory chip 30 in FIG. 4 is set at the test mode, respective signals in the test mode control circuit 58 have waveforms shown in FIG. 13.

The test mode control circuit 58 in this embodiment is changed to the test mode when the respective $\overline{RAS}$, $\overline{CAS}$ and $\overline{WE}$ signals which are externally applied attain a WCBR (Write CAS Before RAS) timing. Therefore, the test can be carried out by applying these signals at the timing shown in FIG. 13.

Referring to FIG. 13, in the WCBR timing, the $\overline{CAS}$ and $\overline{WE}$ signals shown in FIG. 13 (b) and (c) are applied before the input of the $\overline{RAS}$ signal shown in FIG. 10 (a). In the test mode setting, $\overline{OE}$ signal may have any value.

In accordance with the change of the $\overline{RAS}$, $\overline{CAS}$ and $\overline{WE}$ signals shown in FIG. 13 (a)–(c), the latch circuit 90 in FIG. 6 latches the data at the level as shown in FIG. 11 (d), and the output of the latch circuit 90 is fixed at the H-level. As a result, the test control signal 98 supplied from the test mode control circuit 58 changes depending on the $\overline{OE}$ signal.

(4) Test Read Operation

Figure 14:
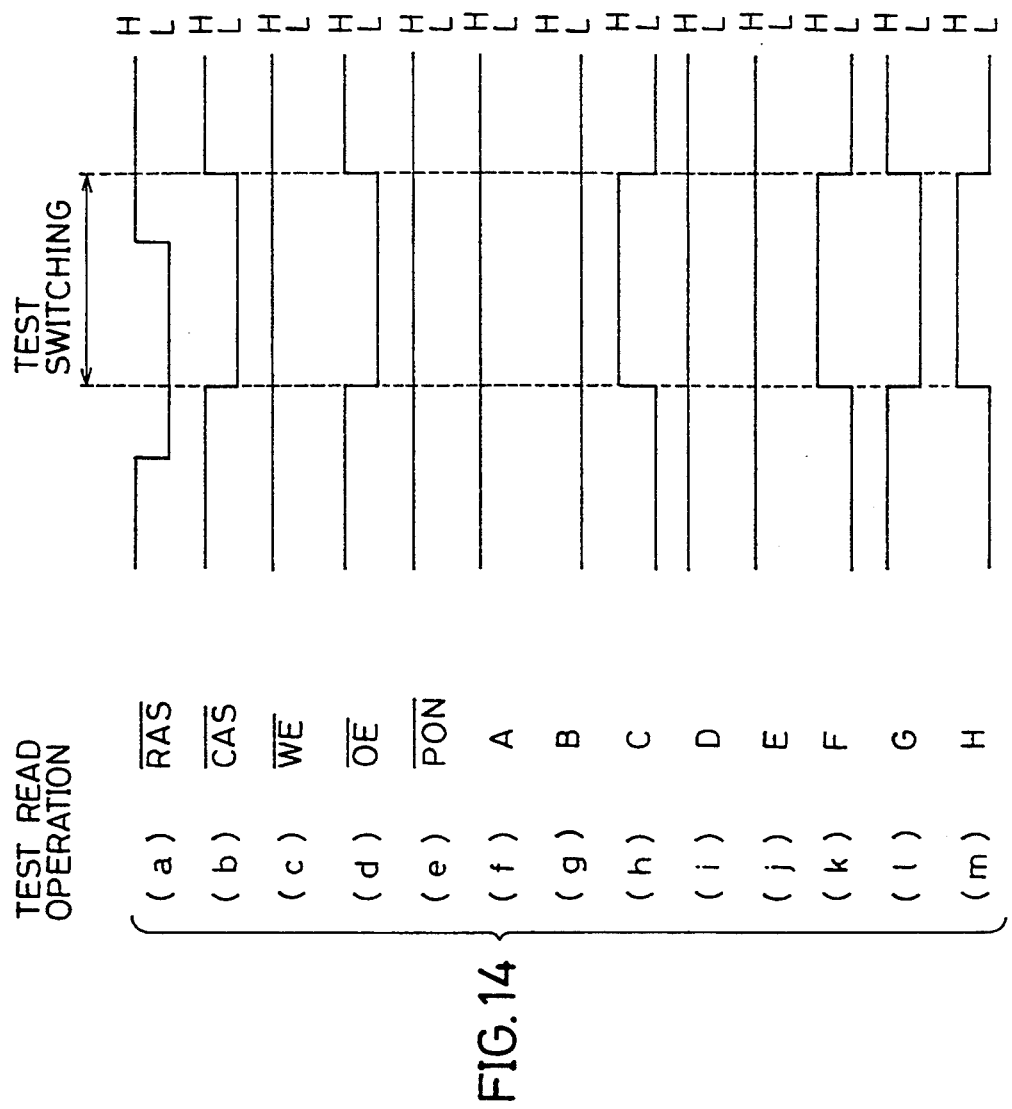
FIG. 14 is a timing chart showing a test read operation.

FIG. 14 shows a timing chart of signals of various portions of the test mode control circuit 58 shown in FIG. 6 in the test read operation. As shown in FIGS. 14 (b) and (d), the $\overline{OE}$ signal changes at the same timing as the $\overline{CAS}$ signal. Thereby, the test control signal 98 supplied from the test mode control circuit 58 shown in FIG. 6 is kept at the H-level while the $\overline{OE}$ signal is maintained at the L-level, and otherwise is maintained at the L-level.

Referring to FIG. 8, when the test control signal 98 is maintained at the L-level, the data output buffer 46 is connected to the I/O pin $DO_1$. When the test control signal 98 attains the H-level, the transfer gate 144 opens, so that the data output buffer 46 is disconnected from the I/O pin $DO_1$.

Referring to FIG. 7, each of the switch circuits 124, 126 and 128 operates similarly to the switch circuit 122.

It is assumed that the memory cell array 42 stores predetermined data previously written by the ordinary write operation. In the test read operation, one bit of data is read from the same address of each of the memory blocks 42a–42d by the operation similar to the operation in the ordinary read cycle, and is stored in the data output buffer 46. The data of 4 bits stored in the data output buffer 46 is applied to the 1-bit test mode circuits 112, 114, 116 and 118 in FIG. 7, respectively, each receiving one bit. Also the tester supplies data indicative of the respected values of the data to be read from the respective memory blocks through the corresponding I/O pins $DO_1$-$DO_4$ in FIG. 7.

For example, in the 1-bit test mode circuit 112 shown in FIG. 7, the switch circuit 122 is opened by the test control signal 98. Therefore, one bit, which is read, e.g., from the memory block 42a and applied by the data output buffer 46, and the expected value applied from the I/O pin $DO_1$ are applied to the data comparator 130.

Referring to FIG. 9, the EXOR circuit 146 in the data comparator 130 supplies the signal at the L-level to the error signal superposing logic 120 if one bit supplied from the data output buffer 46 is coincident with the expected value applied from the I/O pin $DO_1$. And otherwise the data comparator 130 applies the signal at the H-level to the error signal superposing logic 120.

Referring to FIG. 7 again, the other comparators 132, 134 and 136 operate in a similar manner. The data comparator 132 supplies the signal at the L-level to the error signal superposing logic 120 when one bit supplied from the memory block 42b is coincident with the expected value applied from the I/O pin $DO_2$, and otherwise applies the signal at the H-level to the error signal superposing logic 120. The data comparator 134 supplies the signal at the L-level to the error signal superposing logic 120 when one bit supplied from the memory block 42c is coincident with the expected value applied from the I/O pin $DO_3$, and otherwise applies the signal at the H-level to the error signal superposing logic 120. The data comparator 136 supplies the signal at the L-level to the error signal superposing logic 120 when one bit supplied from the memory block 42d is coincident with the expected value applied from the I/O pin $DO_4$, and otherwise applies the signal at the H-level to the error signal superposing logic 120.

Referring to FIG. 10, the OR circuit 148 in the superposing logic 120 supplies the signal at the L-level to the error flag output pin 64 when all the signals applied from the data comparators 130, 132, 134 and 136 are at the L-level. The superposing logic 120 supplies the signal at the H-level to the error flag output pin 64 when at least one of them is at the H-level. Therefore, the signal supplied to the error flag output pin 63 attains the H-level when the data of 4 bits read from the memory blocks 42a-42d includes at least one bit different from the expected value. This signal 150 is referred to as an error flag signal.

Referring to FIG. 4, when the error flag output pin 64 formed of an I/O pin which has not conventionally been used supplies the error flag signal at the L-level, all the 4 bits at the address which is being tested are confirmed to be correct values. If the error flag signal 150 is at the H-level, the 4 bits of the data which is being tested are found to include at least one error. Therefore, whether the memory cell array 42 contains a defect or not can be determined by observing the value of the error flag signal 150.

In the semiconductor memory chip 30 in this embodiment, an NC pin, which has not conventionally been used, is used as the output pin for the error flag signal. Therefore, it is not necessary to additionally provide a pin dedicated to output of the error flag, and thus increase of the number of pins can be prevented. Since 4 bits of the memory cell array can be simultaneously tested, the time for the test of the memory cell array can be reduced, compared with the memory chip of the 1 Mbit×1 structure. It is not necessary to individually determine the defectiveness of each bit of the memory cell array, but it is necessary only to determine whether four bits are correct as a whole or include a defective bit(s). Therefore, only one error flag output pin is required, and thus increase of the number of pins can be suppressed.

Figure 15:
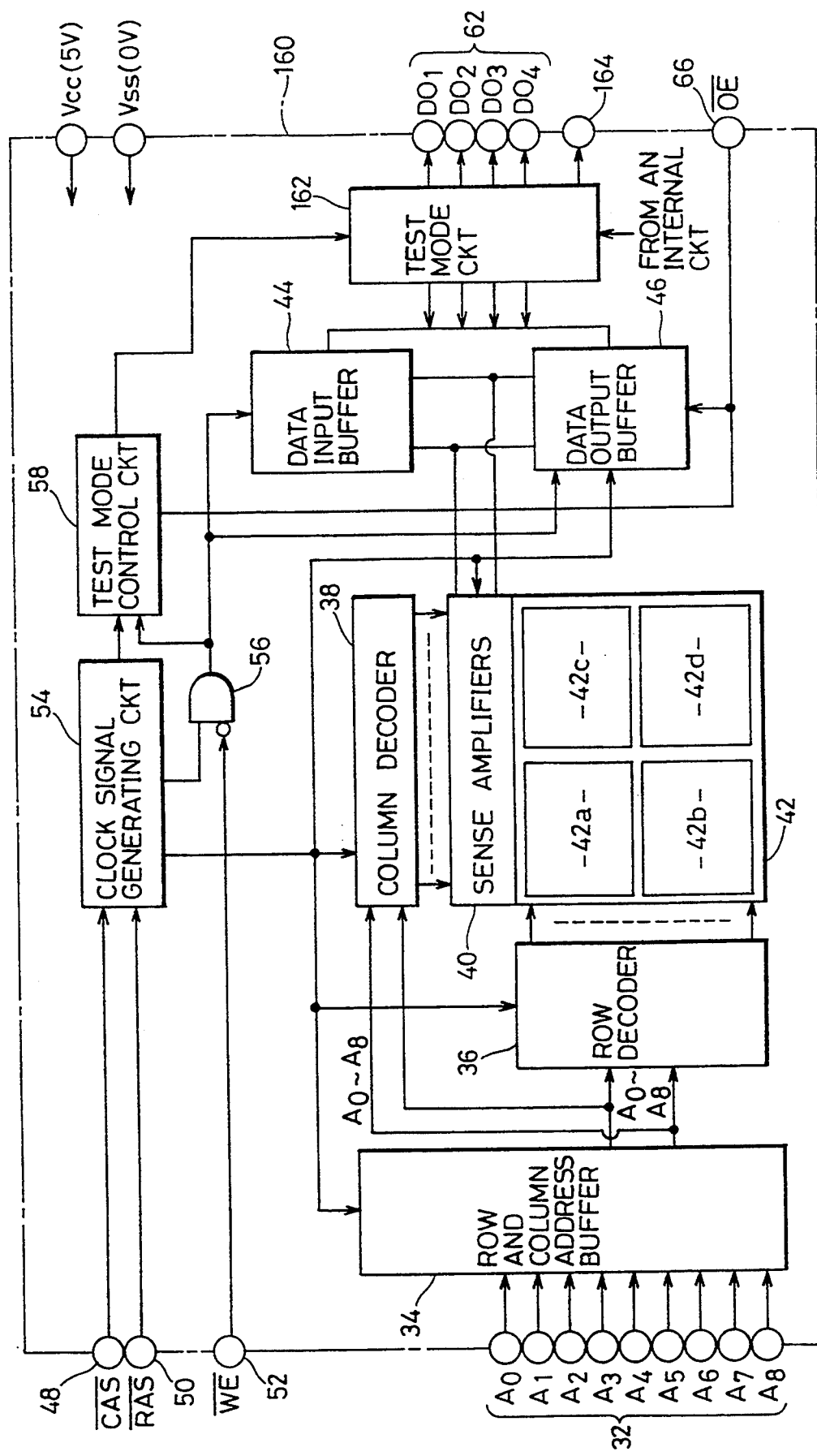
FIG. 15 is a block diagram of a semiconductor memory chip of a second embodiment of the invention.

FIG. 15 is a block diagram of a semiconductor memory chip 160 of a 256 Kbits×4 structure of a second embodiment of the invention. The semiconductor memory chip 160 shown in FIG. 15 differs from the semiconductor memory chip 30 shown in FIG. 4 in that it includes, instead of the test mode circuit 60 in FIG. 4, an internal circuit used for the ordinary operation carried out in the semiconductor memory chip 160, an I/O pin 164 provided for the internal circuit, and a test mode circuit 162 which is connected to the I/O pins 62, data input buffer 44 and data output buffer 46. The test mode circuit 162 is controlled by the test mode control circuit 58 for supplying the error flag signal through the I/O pin 164 in the test operation. Referring to FIGS. 15 and 4, the same parts and portions bear the same reference numerals and names. They have the same functions. Therefore, they will not be detailed herein.

Figure 16:
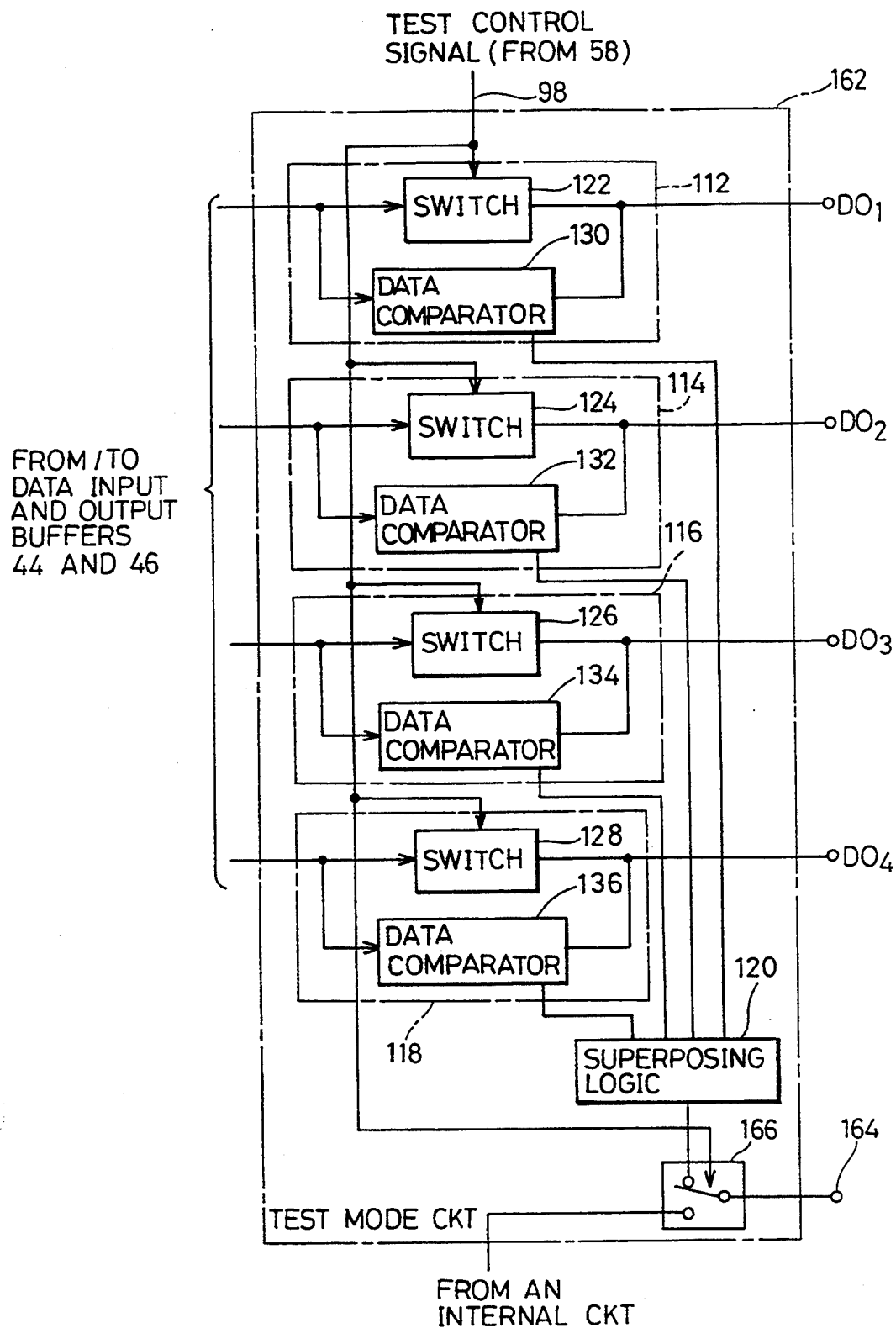
FIG. 16 is a block diagram of a test mode circuit of the second embodiment.

Referring to FIG. 16, the test mode circuit 162 differs from the test mode circuit 60 shown in FIG. 7 in that it further includes a selector 166, which has one input connected to the output of the superposing logic 120 and the other input connected to the internal circuit (not shown). The selector 166 is controlled by the test control signal 98 to selectively connect the output of the superposing logic 120 or the output of the internal circuit to the I/O pin 164. In FIGS. 16 and 7, the same parts and portions bear the same reference numerals and names. They have the same functions, and therefore will not be described hereinafter.

Figure 17:
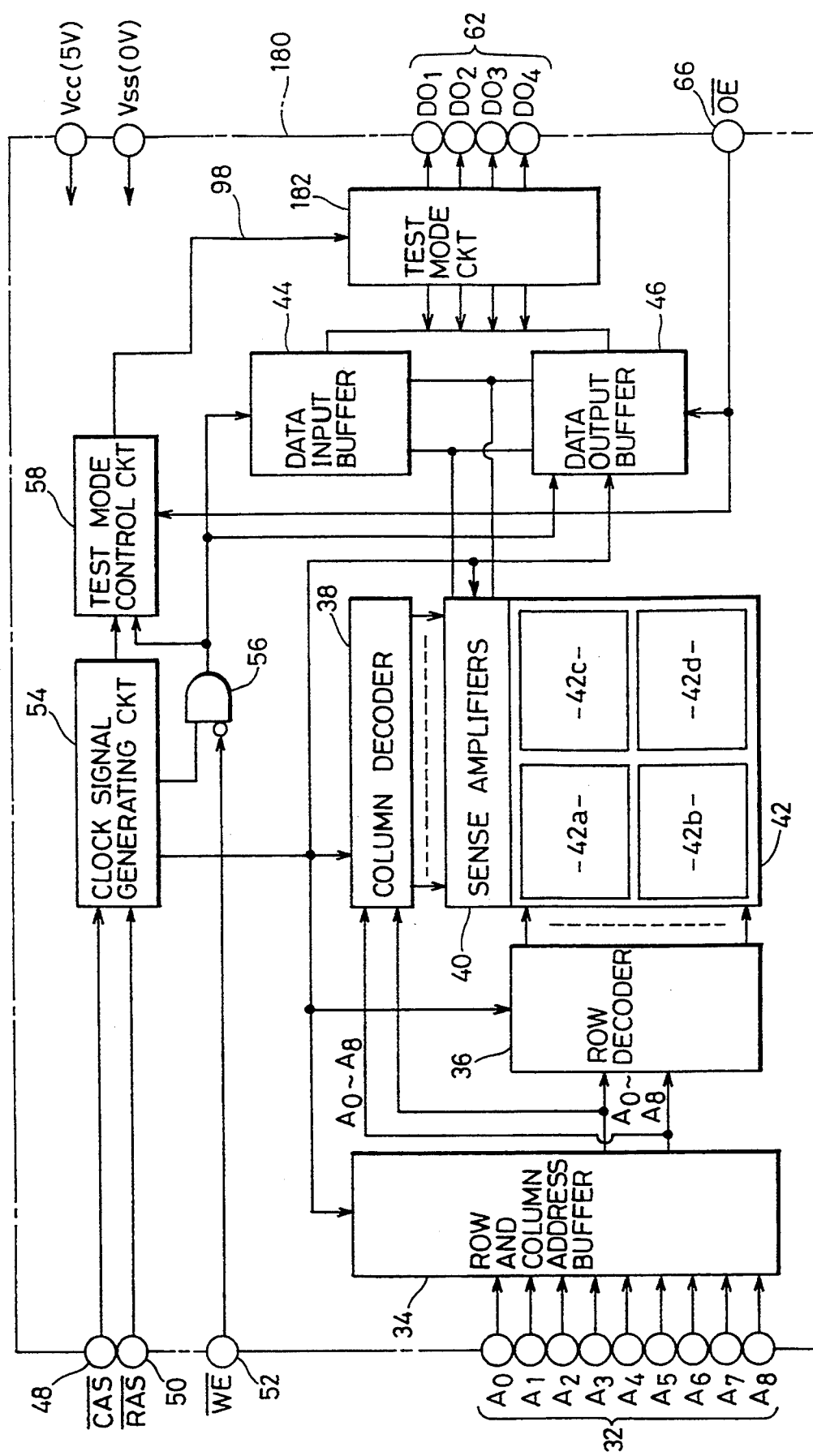
FIG. 17 is a block diagram of a semiconductor memory chip of a third embodiment of the invention.

The semiconductor memory chip 160 and the test mode circuit 162 in the second embodiment operate as follows. In the ordinary read and write operations, the test control signal 98 is fixed at the L-level, as described before. All the switch circuits 122, 124, 126 and 128 are closed. Therefore, the I/O pins $DO_1$-$DO_4$ are connected to the data input buffer 44 and data output buffer 46. Referring to FIG. 17, the selector 166 selects the output of the internal circuit to be connected to the I/O pin 164. In the ordinary write operation, the I/O pins $DO_1$-$DO_4$ receive the data to be written into the memory cell array 42. In the ordinary read operation, the data read from the memory cell array 42 is externally supplied from the I/O pins $DO_1$-$DO_4$. The internal circuit (not shown) transmits signals to and from external circuits through the I/O pin 164.

In the test mode, the test control signal 98 alternately attains the H-level and L-level at a predetermined timing. When the test control signal 98 is at the L-level, each of the switch circuits 122-128 is closed, similarly to the ordinary read and write operations. When the test control signal 98 attains the H-level, all the switch circuits 122, 124, 126 and 128 are closed. The selector 166 connects the output of the superposing logic 120 to the I/O pin 164.

Referring to FIG. 16, the data comparator 130, e.g., in the 1-bit test mode circuit 112 compares one bit read from the memory block 42a with the expected value of one bit supplied through the I/O pin $DO_1$, as already stated with reference to FIG. 7. When they are coincident with each other, the data comparator 130 applies the signal at the L-level to the superposing logic 120, and otherwise applies the signal at the H-level to the superposing logic 120. The other data comparators 132, 134 and 136 each carries out the similar operation in connection with 1 bit read from the corresponding memory block 42b, 42c or 42d, and apply the results of comparison to the superposing logic 120.

As stated before, the superposing logic 120 applies to the I/O pin 164 through the selector 166 the error flag signal, which is at the H-level when at least one of the comparison results by the data comparators 130, 132, 134 and 136 indicates noncoincidence, and is at the L-level when all of them indicate coincidence. Therefore, by inspecting the value of the error flag signal appearing at the I/O pin 164, it is possible to determine whether all the data read from the same address in the memory blocks 42a–42d are correct or not.

In the semiconductor memory chip of the second embodiment, the I/O pin, which is used for the internal circuit in the ordinary operation, is used for supplying the data flag signal therethrough in the test operation. Therefore, it is not necessary to provide a pin dedicated to output of the error flag signal, and thus pins do not increase in number. Since 4 bits of data in the memory cell array can be tested simultaneously, the time for the test can be reduced.

The semiconductor memory chips of the first and second embodiments have a following advantage in connection with the test of a plurality of semiconductor memory chips. In the test of the plurality of semiconductor memory chips, generally it is not necessary to use different data as the test data to be written into the memory cell arrays. Therefore, the same test data can be written at the same address in all the semiconductor memory chips under test. When the data at the same address are to be tested, the same data can be applied as the expected value to each I/O pin of the plurality of semiconductor memory chips. Thus, a single tester can be used, and the data of 4 bits supplied from the tester can be divided and applied to the respective semiconductor memory chips. One error flag signal is obtained in connection with each semiconductor memory chip. The tester requires only one pin per one semiconductor memory chip for receiving the signal.

The read data may be supplied into the tester through the I/O pin for comparing it with the expected value by the tester itself, in departure from the embodiments in which the comparison is carried out by the semiconductor memory chip. In this case, the number of pins required in the tester increases proportionally to the number of the conventional semiconductor memory chips to be tested and the number of pins of the conventional semiconductor memory chip. According to the semiconductor memory chips of the foregoing embodiments of the invention, however, a plurality of semiconductor memory chips can be readily tested in a short time without significantly increasing the number of pins of the tester.

FIG. 17 is a block diagram of a semiconductor memory chip 180 of a third embodiment of the invention. The semiconductor memory chip 180 shown in FIG. 17 differs from the semiconductor memory chip 130 of the first embodiment shown in FIG. 4 in that it includes a test mode circuit 182, instead of the test mode circuit 60 for supplying the error flag signal to the error flag I/O pin 64 in FIG. 4. In the operation cycles for reading and comparing data in the test mode, the test mode circuit 182 temporarily holds the comparison result, e.g., in the latch circuit, and supplies the same through one of the I/O pins 62 (e.g., I/O pin $DO_1$) in the next operation cycle. In FIGS. 17 and 4, the same parts and portions bear the same reference numerals and names. They have the same functions, and thus will not be described herein.

Figure 18:
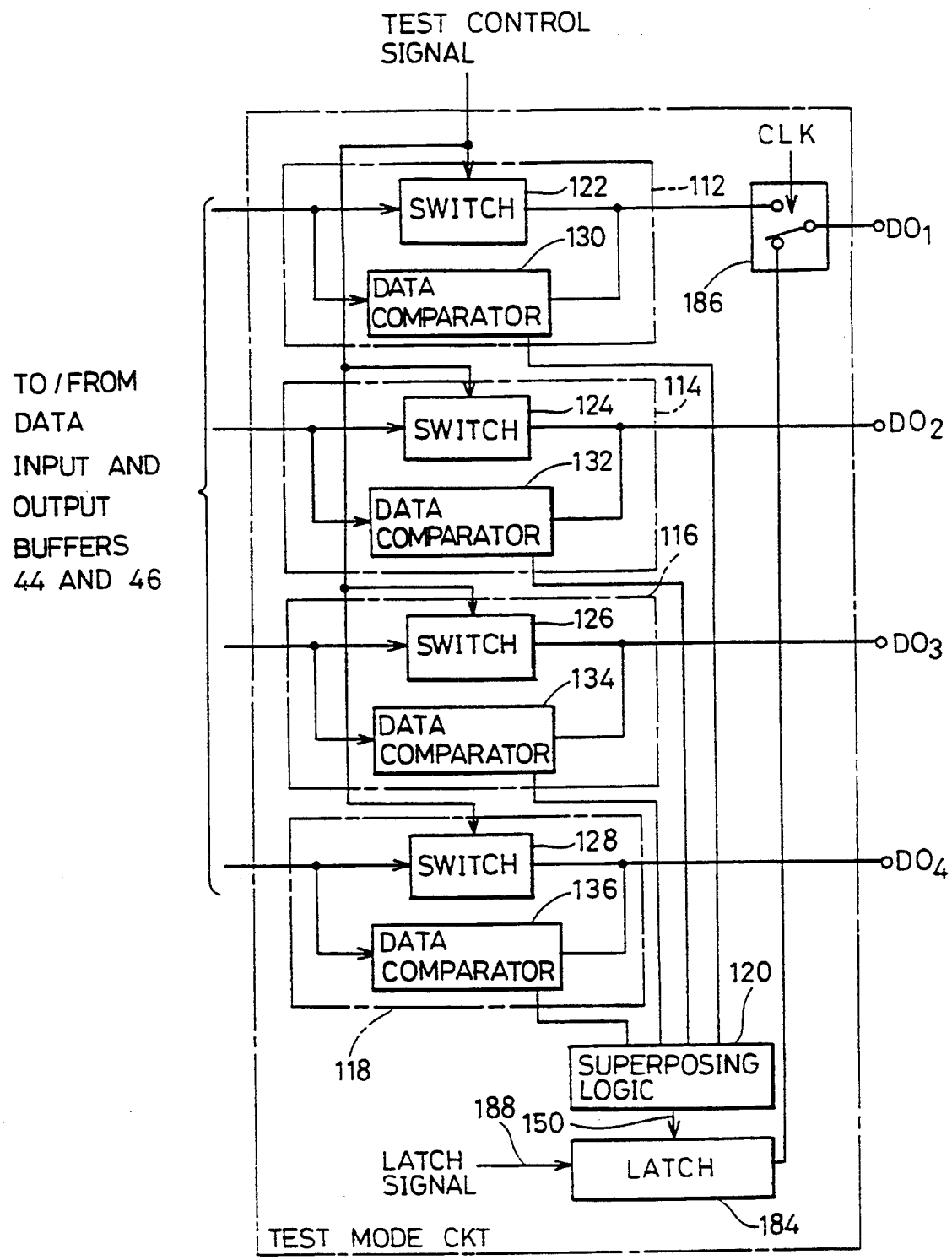
FIG. 18 is a block diagram of a test mode circuit of the third embodiment.

FIG. 18 is a block diagram of the test mode circuit 182 shown in FIG. 17. The test mode circuit 182 shown in FIG. 18 differs from the test mode circuit 60 shown in FIG. 17 in that it includes a latch circuit 184 and a selector 186. The latch circuit 184 has an input connected to the output of the superposing logic 120, and latches the error flag signal 150 in response to a latch signal 188 which is applied thereto with a predetermined relationship with respect to a timing of output of the error flag signal 150 from the superposing logic 120. The selector 186 is responsive to the clock signal to select either the terminal of the switch circuit 122 or the output of the latch circuit 184 to connect the same to the I/O pin $DO_1$. In FIGS. 18 and 7, the same parts and portions bear the same reference numerals and names. They have the same functions, and thus will not be described herein.

Figure 19:
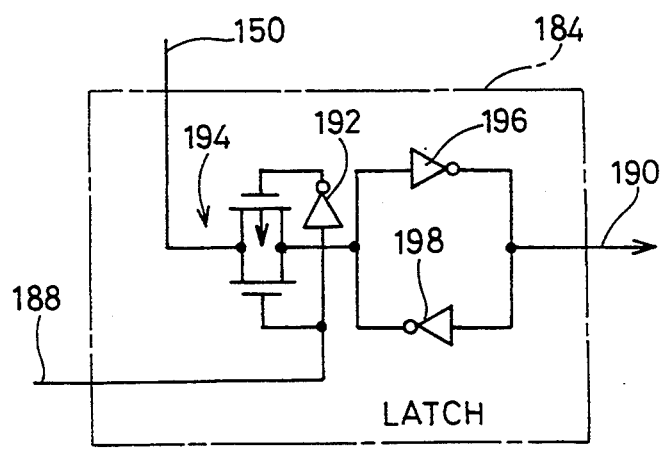
FIG. 19 is a block diagram of a latch circuit.

FIG. 19 is a circuit block diagram of an example of the latch circuit 184. Referring to FIG. 19, the latch circuit 184 includes an inverter 192 for inverting the latch signal 188, a transfer gate 194 operated by the latch signal 188 and an output of the inverter 192, and a latch which receives the error flag signal 150 through the transfer gate 194 and is formed of inverters 196 and 198. An output of the inverter 198 and an input of the inverter 196 are connected to the transfer gate 194. An output of the inverter 196 and an input of the inverter 198 are connected together, and a potential at this connected portion forms the error flag signal 190.

The test mode circuit 182 shown in FIG. 18 operates as follows. In the ordinary read operation or ordinary write operation, the test control signal 98 is fixed at the L-level. The selector 186 connects the switch circuit 122 to the I/O pin $DO_1$. Therefore, the data input buffer 44 and the data output buffer 46 are connected to the I/O pins $DO_1$–$DO_4$ in the same fashion as that in the ordinary read operation and ordinary write operation of the test mode circuit 60 shown in FIG. 7, and the operation is carried out in the same manner.

In the test mode operation, the test control signal 98 alternately attains the H-level and L-level at a predetermined timing. When the test control signal 98 is at the L-level, the connection of test mode circuit 182 is as described before. When the test control signal 98 attains the H-level, the connection of the test mode circuit 182 changes as follows. In a first operation cycle, the selector 186 connects the switch circuit 122 and the I/O pin $DO_1$. The switch circuit 122 is open. Thus, the data comparator 130 receives 1 bit read from the memory block 42a and the expected value applied from the I/O pin $DO_1$. The data comparator 130 applies the signal indicative of the result of comparison, i.e., the signal at the L-level indicative of coincidence or the signal at the H-level indicative of noncoincidence, to the superposing logic 120.

The other comparators 132, 134 and 136 operate similarly with respect to the data read from the memory blocks 42b, 42c and 42d and the expected values. Each signal indicative of the comparison result is applied to the superposing logic 120. The superposing logic 120 superposes these four signals, and supplies to the latch circuit 184 the error flag signal 150, which is at the L-level when all the input signals are at the L-level, and otherwise is at the H-level. The latch circuit 184 temporarily holds the error flag signal 150 in response to the latch signal 188, and applies the same to the selector 186.

In the subsequent operation cycle in the test mode, the selector 186 connects the output of the latch circuit 184 and the I/O pin DO$_1$. Therefore, the error flag signal 150 supplied by the superposing logic 120 is sent through the I/O pin DO$_1$. The tester applies the expected value to each of the I/O pins DO$_1$–DO$_4$ at the first operation cycle in the test mode, and reads the error flag signal 150 from the I/O pin DO$_1$ at the next operation cycle. By inspecting the value of the error flag signal 150, it is possible to determine whether all the data at the address in question in the memory blocks 42$a$–42$d$ are correct or not.

In the semiconductor memory chip of the third embodiment, the I/O pins are also used as the pins for supplying the error flag signals. Although the operation time for the test is slightly longer than those of the first and second embodiments, the pin dedicated to the output of the error flag signal is not required. Therefore, the number of the pins does not increase.

Figure 20:
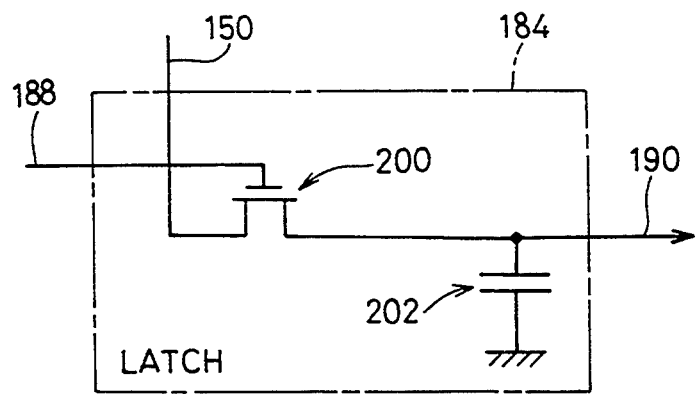
FIG. 20 is a block diagram of a latch circuit of another embodiment.

FIG. 20 is a block diagram of another example of the latch circuit 184. Referring to FIG. 20, the latch circuit 184 includes a field effect transistor 200 and a capacitor 202. The latch signal 188 is applied to a gate of the field effect transistor 200. When the field effect transistor 200 is turned on in response to the latch signal 188, the error flag signal 150 is applied to the capacitor 202. When the field effect transistor 200 is turned off, a charge corresponding to the error flag signal remains in the capacitor 202. A potential of a junction between the field effect transistor 200 and the capacitor 202 forms an error flag signal 190 supplied therefrom.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   means for supplying a mode designating signal having one of first and second values different from one another;
   memory means including a plurality of memory sections;
   selecting means for selecting a same address in each of said memory sections for reading and writing data;
   a plurality of input/output pins, each provided correspondingly to one of said memory sections for transmitting said data read and written by said selecting means;
   a plurality of comparing means, arranged between said selecting means and said plurality of input/output pins, each provided correspondingly to one of said memory sections, each of said comparing means being responsive to said second value of said mode designating signal to compare said data read from a corresponding memory section with data supplied through a corresponding input/output pin; and
   first and second input terminals for receiving externally applied control signals;
   wherein said means for supplying said mode designating signal includes means for supplying said first value in ordinary operation and means for supplying said second value in response to a predetermined sequence of said control signals supplied to said first and second input terminals.

2. A semiconductor memory device according to claim 1, further comprising coincidence detecting means, connected to an output of each of said comparing means, for detecting whether or not all data read from said respective memory sections coincide with data supplied through said corresponding input/output pins.

3. A semiconductor memory device according to claim 1, wherein said plurality of memory sections have the same storage capacity.

4. A semiconductor memory device according to claim 1, wherein said memory device includes said memory sections of which number is equal to the power of 2.

5. A semiconductor memory device according to claim 4, wherein said memory device includes four said memory sections.

6. A semiconductor memory device comprising:
   means for supplying a mode designating signal having one of first and second values different from one another;
   memory means including a plurality of memory sections;
   selecting means for selecting a same address in each of said memory sections for reading and writing data;
   a plurality of input/output pins, each provided correspondingly to one of said memory sections for transmitting said data read and written by said selecting means;
   a plurality of comparing means, arranged between said selecting means and said plurality of input/output pins, each are provided correspondingly to one of said memory sections, each of said comparing means being responsive to said second value of said mode designating signal to compare said data read from a corresponding memory section with data supplied through a corresponding input/output pin;
   coincidence detecting means, connected to an output of each of said comparing means, for detecting whether or not all data read from said respective memory sections coincide with data supplied through said corresponding input/output pins; and
   a no-connection input/output pin, not used in an ordinary operation and is connected to an output of said coincidence detecting means.

7. A semiconductor memory device according to claim 6, further comprising:
   first and second input terminals for receiving externally applied control signals; and wherein
   said means for supplying said mode designating signal includes means for supplying said first value in an ordinary operation and supplying said second value in response to change in a predetermined sequence of said control signals supplied to said first and second input terminals.

8. A semiconductor memory device according to claim 6, wherein each of said comparing means includes;
   switching means, which is arranged between said selecting means and the corresponding input/output pins and is provided correspondingly to one of said memory sections for selectively forming and breaking electric connection between said selecting means and said input/output pin in response to said mode designating signal; and a comparing circuit, which is located between said selecting means and corresponding one of said input/output pins in parallel to said switching means, and is provided correspondingly to one of said memory sections for comparing data supplied from said selecting means with data externally applied through said input/output pin.

9. A semiconductor memory device comprising:

means for supplying a mode designating signal having one of first and second values different from one another;

memory means including a plurality of memory sections;

selecting means for selecting a same address in each of said memory sections for reading and writing data;

a plurality of input/output pins, each provided correspondingly to one of said memory sections for transmitting said data read and written by said selecting means;

a plurality of comparing means, arranged between said selecting means and said plurality of input/output pins, each provided correspondingly to one of said memory sections, each of said comparing means being responsive to said second value of said mode designating signal to compare said data read from a corresponding memory section with data supplied through a corresponding input/output pin; and coincidence detecting means, connected to an output of each of said comparing means, for detecting whether or not all data read from said respective memory sections coincide with data supplied through said corresponding input/output pins;

a predetermined internal circuit operable to carry out external data transmission when said mode designating signal has said first value;

internal circuit input/output pin for said internal circuit; and switching means connected to said internal circuit and an output of said coincidence detecting means for selectively connecting said internal circuit or said output of said coincidence detecting means to said internal circuit input/output pin in response to said mode designating signal.

10. A semiconductor memory device according to claim 9, wherein each of said comparing means includes;

switching means, which is arranged between said selecting means and the corresponding input/output pins and is provided correspondingly to one of said memory sections for selectively forming and breaking electric connection between said selecting means and said input/output pin in response to said mode designating signal; and a comparing circuit, which is located between said selecting means and corresponding one of said input/output pins in parallel to said switching means, and is provided correspondingly to one of said memory sections for comparing data supplied from said selecting means with data externally applied through said input/output pin.

11. A semiconductor memory device according to claim 9, further comprising:

first and second input terminals for receiving externally applied control signals; and wherein said means for supplying said mode designating signal includes means for supplying said first value in an ordinary operation and supplying said second value in response to change in a predetermined sequence of said control signals supplied to said first and second input terminals.

12. A semiconductor memory device comprising:

means for supplying a mode designating signal having one of first and second values different from one another;

memory means including a plurality of memory sections;

selecting means for selecting a same address in each of said memory sections for reading and writing data;

a plurality of input/output pins, each provided correspondingly to one of said memory sections for transmitting said data read and written by said selecting means;

a plurality of comparing means, arranged between said selecting means and said plurality of input/output pins, each are provided correspondingly to one of said memory sections, each of said comparing means being responsive to said second value of said mode designating signal to compare said data read from a corresponding memory section with data supplied through a corresponding input/output pin; and coincidence detecting means, connected to an output of each of said comparing means, for detecting whether or not all data read from said respective memory sections coincide with data supplied through said corresponding input/output pins;

wherein said plurality of comparing means include a first comparing means, said plurality of input/output pins include a first input/output pin corresponding to said first comparing means; and said semiconductor memory device further comprises:

holding means for temporarily holding an output of said coincidence detecting means, switching means provided between said first input/output pin and said first comparing means for selectively connecting said first comparing means or an output of said holding means to said first input/output pin, and connection control means responsive to said second value of said mode designation signal to select different connections of said switching means in a certain operation cycle and subsequent another operation cycle.

13. A semiconductor memory device according to claim 12 wherein each of said comparing means includes;

switching means, which is arranged between said selecting means and the corresponding input/output pins and is provided correspondingly to one of said memory sections for selectively forming and breaking electric connection between said selecting means and said input/output pin in response to said mode designating signal; and a comparing circuit, which is located between said selecting means and corresponding one of said input/output pins in parallel to said switching means, and is provided correspondingly to one of said memory sections for comparing data supplied from said selecting means with data externally applied through said input/output pin.

14. A semiconductor memory device according to claim 12, further comprising:
first and second input terminals for receiving externally applied control signals; and wherein
said means for supplying said mode designating signal includes means for supplying said first value in an ordinary operation and supplying said second value in response to change in a predetermined sequence of said control signals supplied to said first and second input terminals.

15. A semiconductor memory device comprising:
means for supplying a mode designating signal having one of first and second values different from one another;
memory means including a plurality of memory sections;
selecting means for selecting a same address in each of said memory sections for reading and writing data;
a plurality of input/output pins, each provided correspondingly to one of said memory sections for transmitting said data read and written by said selecting means; and
a plurality of comparing means, arranged between said selecting means and said plurality of input/output pins, each are provided correspondingly to one of said memory sections, each of said comparing means being responsive to said second value of said mode designating signal to compare said data read from a corresponding memory section with data supplied through a corresponding input/output pin;
wherein each of said comparing means includes:
switching means, arranged between said selecting means and corresponding input/output pins and provided corresponding to one of said memory sections for selectively forming and breaking electrical connection between said selecting means and said input/output pin in response to said mode designating signal; and
a comparing circuit, located between said selecting means and a corresponding one of said input/output pins in parallel to said switching means, said comparing circuit provided corresponding to one of said memory sections for comparing data supplied from said selecting means with data externally applied through said input/output pin.

16. A semiconductor memory device comprising:
means for supplying a mode designating signal having one of first and second values different from one another;
memory means including a plurality of memory sections;
selecting means for selecting a same address in each of said memory sections for reading and writing data;
a plurality of input/output pins, each provided correspondingly to one of said memory sections for transmitting said data read and written by said selecting means;
a plurality of comparing means, arranged between said selecting means and said plurality of input/output pins, each are provided correspondingly to one of said memory sections, each of said comparing means being responsive to said second value of said mode designating signal to compare said data read from a corresponding memory section with data supplied through a corresponding input/output pin; and
coincidence detecting means, connected to an output of each of said comparing means, for detecting whether or not all data read from said respective memory sections coincide with data supplied through said corresponding input/output pins;
wherein each of said comparing means includes:
switching means, arranged between said selecting means and corresponding input/output pins and provided corresponding to one of said memory sections for selectively forming and breaking electrical connection between said selecting means and said input/output pin in response to said mode designating signal; and
a comparing circuit, located between said selecting means and a corresponding one of said input/output pins in parallel to said switching means, said comparing circuit provided corresponding to one of said memory sections for comparing data supplied from said selecting means with data externally applied through said input/output pin.

* * * * *